(12) United States Patent
Hall et al.

(10) Patent No.: US 9,472,418 B2
(45) Date of Patent: *Oct. 18, 2016

(54) METHOD FOR FORMING A SPLIT-GATE DEVICE

(71) Applicants: Mark D. Hall, Austin, TX (US); Mehul D. Shroff, Austin, TX (US)

(72) Inventors: Mark D. Hall, Austin, TX (US); Mehul D. Shroff, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/228,672

(22) Filed: Mar. 28, 2014

(65) Prior Publication Data

US 2015/0279853 A1    Oct. 1, 2015

(51) Int. Cl.
| | |
|---|---|
| *H01L 21/337* | (2006.01) |
| *H01L 21/3213* | (2006.01) |
| *H01L 29/66* | (2006.01) |
| *H01L 29/423* | (2006.01) |
| *H01L 29/788* | (2006.01) |
| *H01L 27/115* | (2006.01) |

(52) U.S. Cl.
CPC ... *H01L 21/32133* (2013.01); *H01L 27/11534* (2013.01); *H01L 29/42328* (2013.01); *H01L 29/42332* (2013.01); *H01L 29/66545* (2013.01); *H01L 29/66825* (2013.01); *H01L 29/7881* (2013.01)

(58) Field of Classification Search
CPC .................. H01L 21/28282; H01L 29/66545; H01L 21/32133; H01L 27/11534; H01L 29/42332; H01L 29/66825; H01L 29/7881; H01L 29/42328
See application file for complete search history.

(56) References Cited

U.S. PATENT DOCUMENTS

| | | |
|---|---|---|
| 5,614,746 A | 3/1997 | Hong et al. |
| 6,087,225 A | 7/2000 | Bronner et al. |
| 6,194,301 B1 | 2/2001 | Radens et al. |
| 6,235,574 B1 | 5/2001 | Tobben et al. |
| 6,333,223 B1 | 12/2001 | Moriwaki et al. |
| 6,388,294 B1 | 5/2002 | Radens et al. |
| 6,509,225 B2 | 1/2003 | Moriwaki et al. |
| 6,531,734 B1 | 3/2003 | Wu |
| 6,635,526 B1 | 10/2003 | Malik et al. |
| 6,707,079 B2 | 3/2004 | Satoh et al. |

(Continued)

FOREIGN PATENT DOCUMENTS

WO    2009058486    5/2009

OTHER PUBLICATIONS

U.S. Appl. No. 13/491,771, Office Action mailed Mar. 6, 2014.

(Continued)

*Primary Examiner* — Thanh Y Tran

(57) ABSTRACT

A method of forming a semiconductor device in an NVM region and in a logic region uses a semiconductor substrate and includes forming a gate region fill material over the NVM region and the logic region. The gate region fill material is patterned over the NVM region to leave a first patterned gate region fill material over the NVM region. An interlayer dielectric is formed around the first patterned gate region fill material. A first portion of the first patterned gate region fill material is removed to form a first opening and leaving a second portion of the first patterned gate region fill material. The first opening is laterally adjacent to the second portion. The first opening is filled with a charge storage layer and a conductive material that includes metal overlying the charge storage layer.

20 Claims, 17 Drawing Sheets

(56) References Cited

U.S. PATENT DOCUMENTS

| | | |
|---|---|---|
| 6,777,761 B2 | 8/2004 | Clevenger et al. |
| 6,785,165 B2 | 8/2004 | Kawahara et al. |
| 6,939,767 B2 | 9/2005 | Hoefler et al. |
| 7,154,779 B2 | 12/2006 | Mokhlesi et al. |
| 7,183,159 B2 | 2/2007 | Rao et al. |
| 7,190,022 B2 | 3/2007 | Shum et al. |
| 7,202,524 B2 | 4/2007 | Kim et al. |
| 7,208,793 B2 | 4/2007 | Bhattacharyya |
| 7,256,125 B2 | 8/2007 | Yamada et al. |
| 7,271,050 B2 | 9/2007 | Hill |
| 7,365,389 B1 | 4/2008 | Jeon et al. |
| 7,391,075 B2 | 6/2008 | Jeon et al. |
| 7,402,493 B2 | 7/2008 | Oh et al. |
| 7,405,968 B2 | 7/2008 | Mokhlesi et al. |
| 7,439,134 B1 | 10/2008 | Prinz et al. |
| 7,476,582 B2 | 1/2009 | Nakagawa et al. |
| 7,521,314 B2 | 4/2009 | Jawarani et al. |
| 7,524,719 B2 | 4/2009 | Steimle et al. |
| 7,544,490 B2 | 6/2009 | Ferrari et al. |
| 7,544,980 B2 | 6/2009 | Chindalore et al. |
| 7,544,990 B2 | 6/2009 | Bhattacharyya |
| 7,560,767 B2 | 7/2009 | Yasuda et al. |
| 7,795,091 B2 | 9/2010 | Winstead et al. |
| 7,799,650 B2 | 9/2010 | Bo et al. |
| 7,816,727 B2 | 10/2010 | Lai et al. |
| 7,821,055 B2 | 10/2010 | Loiko et al. |
| 7,906,396 B1 | 3/2011 | Chiang et al. |
| 7,932,146 B2 | 4/2011 | Chen et al. |
| 7,989,871 B2 | 8/2011 | Yasuda |
| 7,999,304 B2 | 8/2011 | Ozawa et al. |
| 8,017,991 B2 | 9/2011 | Kim et al. |
| 8,043,951 B2 | 10/2011 | Beugin et al. |
| 8,063,434 B1 | 11/2011 | Polishchuk et al. |
| 8,093,128 B2 | 1/2012 | Koutny et al. |
| 8,138,037 B2 | 3/2012 | Chudzik et al. |
| 8,168,493 B2 | 5/2012 | Kim |
| 8,298,885 B2 | 10/2012 | Wei et al. |
| 8,334,198 B2 | 12/2012 | Chen et al. |
| 8,372,699 B2 | 2/2013 | Kang et al. |
| 8,389,365 B2 | 3/2013 | Shroff et al. |
| 8,399,310 B2 | 3/2013 | Shroff et al. |
| 8,524,557 B1 | 9/2013 | Hall et al. |
| 8,536,006 B2 | 9/2013 | Shroff et al. |
| 8,536,007 B2 | 9/2013 | Shroff et al. |
| 8,679,927 B2 | 3/2014 | Ramkumar et al. |
| 8,901,632 B1* | 12/2014 | Perera ............... H01L 29/7831 257/314 |
| 9,112,056 B1* | 8/2015 | Shroff ............... H01L 21/28273 |
| 2001/0049166 A1 | 12/2001 | Peschiaroli et al. |
| 2002/0061616 A1 | 5/2002 | Kim et al. |
| 2003/0022434 A1 | 1/2003 | Taniguchi et al. |
| 2004/0075133 A1 | 4/2004 | Nakagawa et al. |
| 2004/0262670 A1 | 12/2004 | Takebuchi et al. |
| 2005/0145949 A1 | 7/2005 | Sadra et al. |
| 2006/0038240 A1 | 2/2006 | Tsutsumi et al. |
| 2006/0046449 A1 | 3/2006 | Liaw |
| 2006/0099798 A1 | 5/2006 | Nakagawa |
| 2006/0134864 A1 | 6/2006 | Higashitani et al. |
| 2006/0211206 A1 | 9/2006 | Rao et al. |
| 2006/0221688 A1 | 10/2006 | Shukuri et al. |
| 2007/0037343 A1 | 2/2007 | Colombo et al. |
| 2007/0077705 A1 | 4/2007 | Prinz et al. |
| 2007/0115725 A1 | 5/2007 | Pham et al. |
| 2007/0215917 A1 | 9/2007 | Taniguchi |
| 2007/0224772 A1 | 9/2007 | Hall et al. |
| 2007/0249129 A1 | 10/2007 | Hall et al. |
| 2007/0264776 A1 | 11/2007 | Dong et al. |
| 2008/0029805 A1 | 2/2008 | Shimamoto et al. |
| 2008/0050875 A1 | 2/2008 | Moon et al. |
| 2008/0067599 A1 | 3/2008 | Tsutsumi et al. |
| 2008/0105945 A1 | 5/2008 | Steimle et al. |
| 2008/0121983 A1 | 5/2008 | Seong et al. |
| 2008/0128785 A1 | 6/2008 | Park et al. |
| 2008/0145985 A1 | 6/2008 | Chi |
| 2008/0185635 A1 | 8/2008 | Yanagi et al. |
| 2008/0237690 A1 | 10/2008 | Anezaki et al. |
| 2008/0237700 A1 | 10/2008 | Kim et al. |
| 2008/0283900 A1 | 11/2008 | Nakagawa et al. |
| 2008/0290385 A1 | 11/2008 | Urushido |
| 2008/0308876 A1 | 12/2008 | Lee et al. |
| 2009/0050955 A1 | 2/2009 | Akita et al. |
| 2009/0065845 A1 | 3/2009 | Kim et al. |
| 2009/0072274 A1 | 3/2009 | Knoefler et al. |
| 2009/0078986 A1 | 3/2009 | Bach |
| 2009/0101961 A1 | 4/2009 | He et al. |
| 2009/0111229 A1 | 4/2009 | Steimle et al. |
| 2009/0179283 A1 | 7/2009 | Adams et al. |
| 2009/0225602 A1 | 9/2009 | Sandhu et al. |
| 2009/0256211 A1 | 10/2009 | Booth, Jr. et al. |
| 2009/0269893 A1 | 10/2009 | Hashimoto et al. |
| 2009/0273013 A1 | 11/2009 | Winstead et al. |
| 2009/0278187 A1 | 11/2009 | Toba |
| 2011/0031548 A1 | 2/2011 | White et al. |
| 2011/0095348 A1 | 4/2011 | Chakihara et al. |
| 2011/0204450 A1 | 8/2011 | Moriya |
| 2011/0260258 A1 | 10/2011 | Zhu et al. |
| 2012/0034751 A1 | 2/2012 | Ariyoshi et al. |
| 2012/0104483 A1 | 5/2012 | Shroff et al. |
| 2012/0132978 A1 | 5/2012 | Toba et al. |
| 2012/0142153 A1 | 6/2012 | Jeong |
| 2012/0248523 A1 | 10/2012 | Shroff et al. |
| 2012/0252171 A1 | 10/2012 | Shroff et al. |
| 2013/0026553 A1 | 1/2013 | Horch |
| 2013/0037886 A1 | 2/2013 | Tsai et al. |
| 2013/0065366 A1 | 3/2013 | Thomas et al. |
| 2013/0084684 A1 | 4/2013 | Ishii et al. |
| 2013/0137227 A1 | 5/2013 | Shroff et al. |
| 2013/0171785 A1 | 7/2013 | Shroff et al. |
| 2013/0171786 A1 | 7/2013 | Shroff et al. |
| 2013/0178027 A1 | 7/2013 | Hall et al. |
| 2013/0178054 A1 | 7/2013 | Shroff et al. |
| 2013/0264633 A1 | 10/2013 | Hall et al. |
| 2013/0264634 A1 | 10/2013 | Hall et al. |
| 2013/0267072 A1 | 10/2013 | Hall et al. |
| 2013/0267074 A1 | 10/2013 | Hall et al. |
| 2013/0323922 A1 | 12/2013 | Shen et al. |
| 2014/0035027 A1 | 2/2014 | Chakihara et al. |
| 2014/0050029 A1 | 2/2014 | Kang et al. |
| 2014/0120713 A1 | 5/2014 | Shroff et al. |
| 2015/0279854 A1* | 10/2015 | Hall .................. H01L 21/28282 438/591 |

OTHER PUBLICATIONS

Chen, J.H., et al., "Nonvolatile Flash Memory Device Using Ge Nanocrystals Embedded in HfA10 High-k Tunneling and Control Oxides: Device Fabrication and Electrical Performance", IEEE Transactions on Electron Devices, vol. 51, No. 11, Nov. 2004, pp. 1840-1848.

Kang, T.K., et al., "Improved characteristics for Pd nanocrystal memory with stacked HfAIO-SiO2 tunnel layer", Sciencedirect.com, Solid-State Electronics, vol. 61, Issue 1, Jul. 2011, pp. 100-105, http://wwww.sciencedirect.com/science/article/pii/S0038110111000803.

Krishnan, S., et al.., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1.4, pp. 634-637.

Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.

Liu, Z., et al., "Metal Nanocrystal Memories—Part I: Device Design and Fabrication", IEEE Transactions on Electron Devices, vol. 49, No. 9, Sep. 2002, pp. 1606-1613.

Mao, P., et al., "Nonvolatile memory devices with high density ruthenium nanocrystals", Applied Physics Letters, vol. 93, Issue 24, Electronic Transport and Semiconductors, 2006.

Mao, P., et al., "Nonvolatile Memory Characteristics with Embedded high Density Ruthenium Nanocrystals", http://iopscience.iop.

(56) References Cited

OTHER PUBLICATIONS org/0256-307X/26/5/056104, Chinese Physics Letters, vol. 26, No. 5, 2009.
Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.
Wang, X.P., et al., Dual Metal Gates with Band-Edge Work Functions on Novel HfLaO High-K Gate Dielectric, IEEE, Symposium on VLSI Technology Digest of Technical Papers, 2006.
U.S. Appl. No. 13/402,426, Office Action—Allowance—May 3, 2013.
U.S. Appl. No. 13/789,971, Office Action—Allowance—May 15, 2013.
U.S. Appl. No. 13/491,771, Office Action—Rejection, Sep. 9, 2013.
U.S. Appl. No. 13/442,142, Office Action—Ex Parte Quayle, Apr. 4, 2013.
U.S. Appl. No. 13/442,142, Office Action—Allowance, Aug. 2, 2013.
U.S. Appl. No. 13/907,491, Office Action—Rejection, Sep. 3, 2013.
U.S. Appl. No. 12/915,726, Office Action—Restriction, Jul. 31, 2012.
U.S. Appl. No. 12/915,726, Office Action—Allowance, Dec. 10, 2012.
U.S. Appl. No. 13/781,727, Office Action—Rejection, Aug. 22, 2013.
U.S. Appl. No. 13/077,491, Office Action—Rejection, Aug. 15, 2012.
U.S. Appl. No. 13/077,491, Office Action—Rejection, Feb. 6, 2013.
U.S. Appl. No. 13/077,491, Office Action—Allowance, Jun. 18, 2013.
U.S. Appl. No. 13/077,501, Office Action—Allowance, Nov. 26, 2012.
U.S. Appl. No. 13/313,179, Office Action—Rejection, Aug. 15, 2013.
U.S. Appl. No. 13/307,719, Office Action—Allowance, May 29, 2013.
U.S. Appl. No. 13/343,331, Office Action—Rejection, Mar. 13, 2013.
U.S. Appl. No. 13/343,331, Office Action—Allowance, Jun. 24, 2013.
U.S. Appl. No. 13/441,426, Office Action—Allowance, Sep. 9, 2013.
U.S. Appl. No. 13/780,574, Office Action—Allowance, Sep. 6, 2013.
U.S. Appl. No. 13/491,760, Office Action—Allowance, Jul. 1, 2013.
U.S. Appl. No. 13/491,771, Hall, M., et al., "Integrating Formation of a Replacement Gate Transistor and a Non-Volatile Memory Cell Using a High-K Dielectric", filed Jun. 8, 2012.
U.S. Appl. No. 13/790,225, Hall, M., et al., "Integrating Formation of a Replacement Gate Transistor and a non-Volatile Memory Cell Having Thin Film Storage", filed Mar. 8, 2013.
U.S. Appl. No. 13/790,014, Hall, M., et al., "Integrating Formation of a Logic Transistor and a None-Volatile Memory Cell Using a Partial Replacement Gate Technique", filed Mar. 8, 2013.
U.S. Appl. No. 13/955,665, Perera, A.H., "Non-Volatile Memory (NVM) and High K and Metal Gate Integration Using Gate First Methodology", filed Jul. 31, 2013.
U.S. Appl. No. 14/041,591, Perera, A.H., "Non-Volatile Memory (NVM) and High K and Metal Gate Integration Using Gate Last Methodology", filed Sep. 30, 2013.
U.S. Appl. No. 13/971,987, Perera, A.H., et al., "Integrated Split Gate Non-Volatile Memory Cell and Logic Structure", filed Aug. 21, 2013.
U.S. Appl. No. 13/972,372, Perera, A.H., et al., "Integrated Split Gate Non-Volatile Memory Cell and Logic Device", filed Aug. 21, 2013.
U.S. Appl. No. 14/041,647, Perera, A.H., et al., "Non-Volatile Memory (NVM) and High-K and Metal Gate Integration Using Gate-First", filed Sep. 30, 2013.
U.S. Appl. No. 14/041,662, Perera, A. H., et al., "Non-Volatile Memory (NVM) and High-K and Metal Gate Integration Using Gate-Last Methodology", filed Sep. 30, 2013.
U.S. Appl. No. 13/962,338, Perera, A.H., "Nonvolatile Memory Bitcell With Inlaid High K Metal Select Gate", filed Aug. 8, 2013.
U.S. Appl. No. 13/973,433, Perera, A.H., et al., "Method to Form a Polysilicon Nanocrystal Thin Film Storage Bitcell Within a High K Metal Gate Platform Technology Using a Gate Last Process to Form Transistor Gates", filed Aug. 22, 2013.
U.S. Appl. No. 13/928,666, Hong, C. M., et al., "Non-Volatile Memory (NVM) and High Voltage Transistor Integration", filed Jun. 27, 2013.
U.S. Appl. No. 14/023,440, Baker, F.K., Jr., et al., "Non-Volatile Memory (NVM) Cell and High-K and Metal Gate Transistor Integration", filed Sep. 10, 2013.
U.S. Appl. No. 13/969,180, Perera, A.H., et al., "Non-Volatile Memory (NVM) Cell, High Voltage Transistor, and High-K and Metal Gate Transistor Integration", filed Aug. 16, 2013.
U.S. Appl. No. 13/973,549, Hong, C.M., et al., "Split-Gate non-Volatile Memory (NVM) Cell and Device Structure Integration", filed Aug. 22, 2013.
U.S. Appl. No. 13/780,591, Hall, M.D., et al., "Non-Volatile Memory (NVM) and Logic Integration", filed Feb. 28, 2013.
U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.
U.S. Appl. No. 13/661,157, Shroff, M.D., et al., "Method of Making a Logic Transistor and a Non-Volatile Memory (NVM) Cell", filed Oct. 26, 2012.
U.S. Appl. No. 13/781,727, Office Action—Restriction, Jun. 21, 2013.
U.S. Appl. No. 13/780,591, Office Action—Allowance, Nov. 22, 2013.
U.S. Appl. No. 13/441,426, Shroff, M. D., et al., Office Action—Allowance, mailed Jun. 9, 2014.
U.S. Appl. No. 13/790,225, Office Action—Allowance, Dec. 24, 2013.
U.S. Appl. No. 13/790,014, Office Action—Allowance, Dec. 24, 2013.
U.S. Appl. No. 13/442,142, Office Action—Allowance, Dec. 31, 2013.
U.S. Appl. No. 13/491,771, Office Action—Allowance, Jan. 16, 2014.
U.S. Appl. No. 13/781,727, Office Action—Allowance, Jan. 31, 2014.
U.S. Appl. No. 13/441,426, Office Action—Allowance, Feb. 21, 2014.
U.S. Appl. No. 13/442,142, Office Action—Allowance, Feb. 28, 2014.
U.S. Appl. No. 13/790,014, Office Action—Allowance, Mar. 3, 2014.
U.S. Appl. No. 13/907,491, Office Action—Allowance, Mar. 11, 2014.
U.S. Appl. No. 13/790,225, Office Action—Allowance, Mar. 12, 2014.
U.S. Appl. No. 13/781,727, Office Action—Allowance, May 12, 2014.
U.S. Appl. No. 13/343,331, Office Action—Allowance, Nov. 8, 2013.
U.S. Appl. No. 14/195,299, Shroff, M., et al., "Method of Making a Logic Transistor and a Non-Volatile Memory (NVM) Cell", filed Mar. 3, 2014.
Restriction Requirement mailed Jun. 25, 2015 for U.S. Appl. No. 14/228,678, 8 pages.
U.S. Appl. No. 14/228,678, filed Mar. 28, 2014, entitled "Method for Forming a Split-Gate Device."
U.S. Appl. No. 13/928,666, Hong, Office Action—Rejection, mailed Jul. 23, 2014.
U.S. Appl. No. 14/041,662, Perera, Office Action—Restriction, mailed Aug. 1, 2014.
U.S. Appl. No. 13/969,180, Perera, Office Action—Allowance, mailed Aug. 5, 2014.

(56) References Cited

OTHER PUBLICATIONS

U.S. Appl. No. 13/781,727, Shroff, Office Action—Allowance, mailed Aug. 15, 2014.
U.S. Appl. No. 13/955,665, Office Action—Allowance, mailed Aug. 20, 2014.
U.S. Appl. No. 13/973,549, Hong, Office Action—Restriction, mailed Aug. 26, 2014.
U.S. Appl. No. 13/441,426, Shroff, Office Action—Allowance, mailed Sep. 26, 2014.
U.S. Appl. No. 13/661,157, Office Action—Restriction, mailed Oct. 2, 2014.
U.S. Appl. No. 14/041,662, Perera, Office Action—Allowance, mailed Oct. 17, 2014.
Notice of Allowance mailed Oct. 2, 2015 for U.S. Appl. No. 14/228,678, 8 pages.

\* cited by examiner

METHOD FOR FORMING A SPLIT-GATE DEVICE

CROSS-REFERENCE TO RELATED APPLICATION(S)

This application is related to U.S. patent application Ser. No. 14/228,678, filed on even date, entitled "METHOD FOR FORMING A SPLIT-GATE DEVICE," naming Mark D. Hall and Mehul D. Shroff as inventors, and assigned to the current assignee hereof.

BACKGROUND

1. Field

This disclosure relates generally to semiconductor processing, and more specifically, to a method for forming a split-gate device.

2. Related Art

Many semiconductor devices include, or embed, non-volatile memory (NVM) transistors with other transistor types on the same integrated circuit (IC). The manufacturing processes for the different transistor types may not be the same, requiring that the processes be integrated. For example, to integrate NVM with, for example, CMOS (complementary metal oxide semiconductor), the CMOS process may be modified to include the process steps necessary to fabricate the NVM cell and the supporting devices.

Flash NVM is commonly embedded in, for example, system-on-a-chip (SoC) integrated circuits having CMOS logic circuitry. The flash NVM may include a charge storage layer comprising nanocrystals or an ONO (oxide-nitride-oxide) layer. The memory cell may also include a control gate comprising polysilicon, a metal, or both. In addition, it may be desirable to use a high-k (where k refers to the dielectric constant of the material) gate dielectric in the logic transistor. Integrating the non-volatile memory cell with the logic transistor having the metal gate and the high-k gate dielectric on the same integrated circuit may require many additional process steps.

What is needed is a process integration methodology to efficiently embed an NVM cell array with metal gate/high-k dielectric logic transistors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an integration of a non-volatile memory (NVM) cell and a logic transistor efficiently integrates NVM and logic on a single integrated circuit. This integration allows for flexibility in the choice of materials for the dielectrics and gate materials of the logic gate stack and the select gate stack. In one example integration, a gate last replacement process may be used to form a high-k dielectric (where k represents the dielectric constant of the insulator) and metal gate for each of the logic gate stack and select gate stack of device 10. In another example integration, a high-k first metal gate last replacement process may be used to form a high-k dielectric and metal gate for the logic gate stack and select gate stack. In another example integration, a high-k first metal gate last replacement process may be used to form a high-k dielectric and metal gate for the logic gate stack, while allowing the select gate to remain polysilicon. These embodiments will be better understood by reference to the drawings and the following description.

Figure 1:
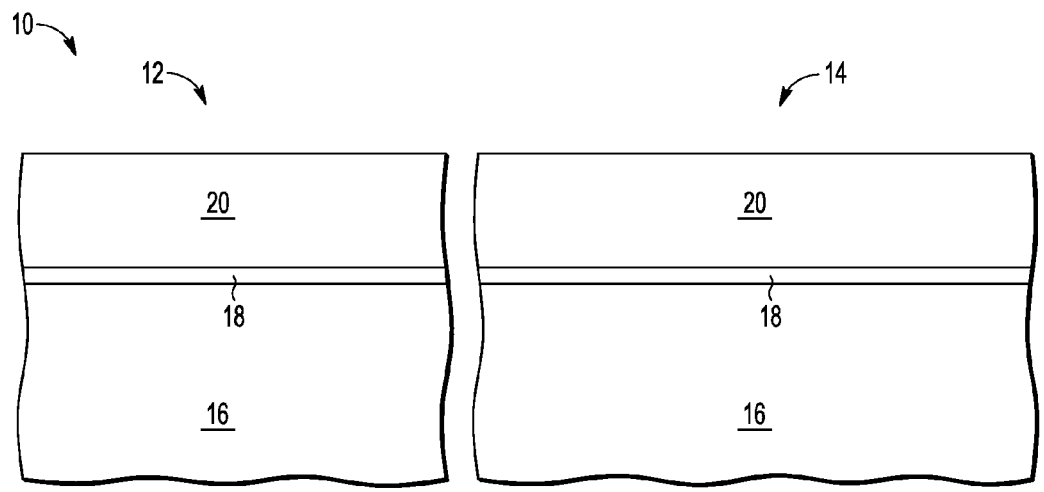
FIGS. 1-11 illustrate, in cross-sectional views, a semiconductor device at various processing stages in accordance with one embodiment of the present invention.

FIG. 1 illustrates, in cross-sectional form, a semiconductor device 10 having a logic region 12 and an NVM region 14 with a substrate 16, a dielectric layer 18 that may be thermal oxide formed on substrate 16, and a layer 20 of gate material that may be polysilicon formed on dielectric layer 18. Dielectric layer 18 may be an oxynitride. Semiconductor substrate 16 can be any semiconductor material or combinations of materials, such as gallium arsenide, silicon germanium, silicon-on-insulator (SOI), silicon, monocrystalline silicon, the like, and combinations of the above. In one embodiment, a hard mask may be formed over layer 20. The hard mask may be silicon nitride.

Figure 2:
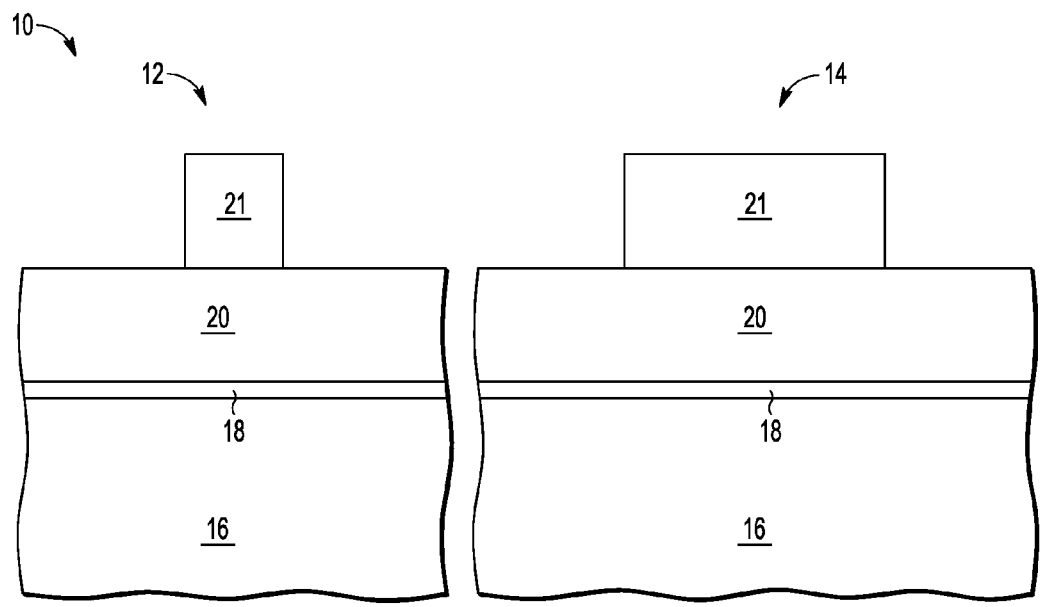

FIG. 2 illustrates, in cross-sectional form, semiconductor device 10 after forming a patterned masking layer 21 over layer 20. Patterned masking layer 21 includes a first portion in logic region 12 which defines the location of a logic gate, and a second portion in NVM region 14 which defines the location of a select gate adjacent a control gate. That is, note that the left edge of the second portion defines the location of a left edge of the select gate, and the right edge of the second portion defines the location of a right edge of the control gate, as will be described in further detail below.

Figure 3:
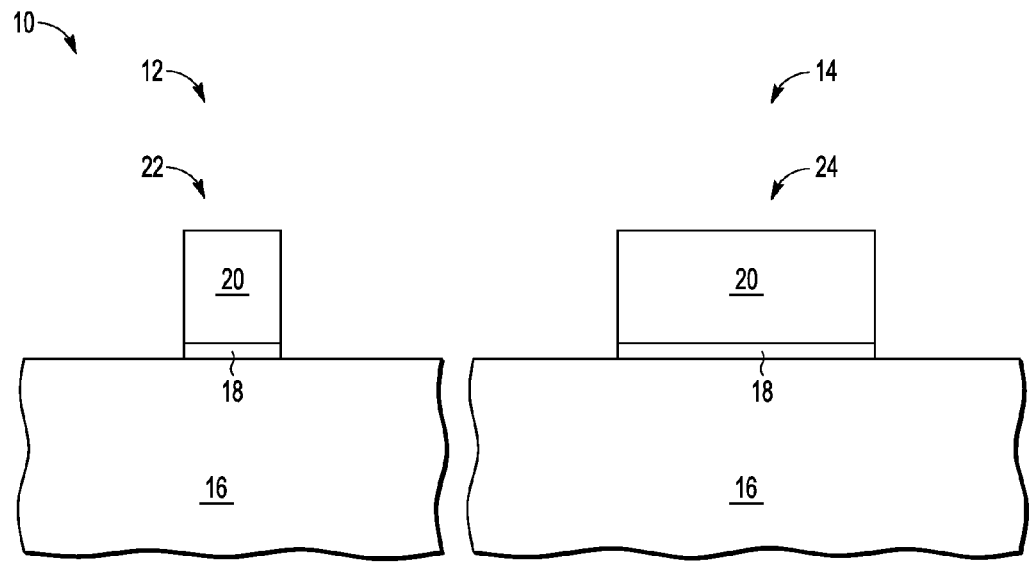

FIG. 3 illustrates, in cross-sectional form, semiconductor device 10 after patterning layer 20 using patterned masking layer 21. Therefore, a gate region fill material 22 remains in logic region 12, and a gate region fill material 24 remains in NVM region 14. Each of gate region fill materials 22 and 24 are formed from layer 20 and may also be referred to as a gate fill layer. Note that portions of dielectric 18 underlying portions of gate region fill materials 22 and 24 also remain. In one embodiment, gate region fill materials 22 and 24 are formed using a same patterned masking layer, such as patterned masking layer 22. In an alternate embodiment, each of gate region fill materials 22 and 24 can be formed in separate patterning steps using separate patterned masking layers. In one embodiment, gate region fill material 24 spans a channel length of a split-gate NVM cell (having a select gate and control gate) to be formed in NVM region 14, and may therefore be referred to as a memory gate region. In one embodiment, gate region fill material 22 corresponds to the location at which a logic transistor will be formed in logic region 12, and may therefore be referred to as a logic gate region.

Figure 4:
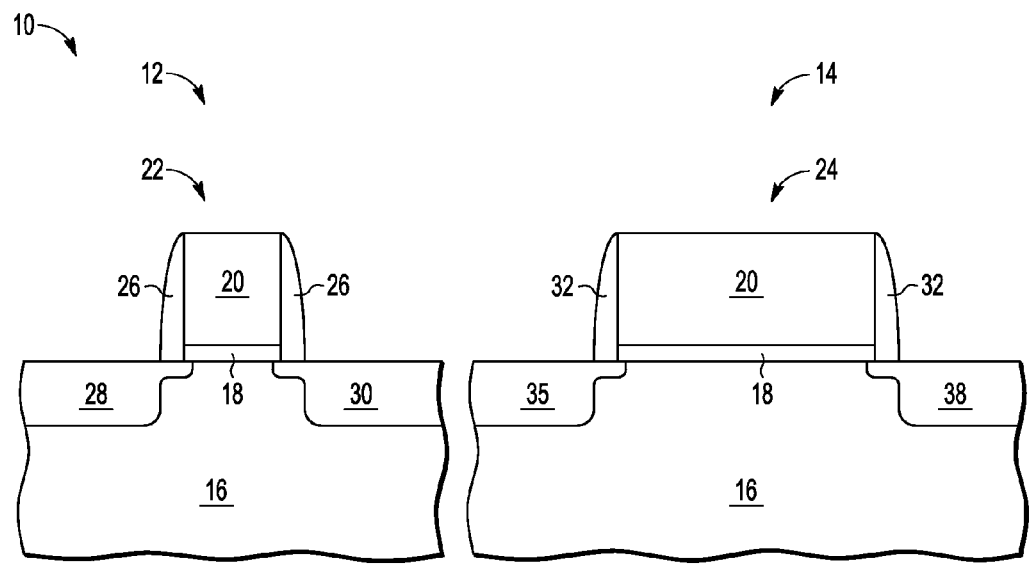

FIG. 4 illustrates, in cross-sectional form, semiconductor device 10 after formation of a sidewall spacer 26 around gate region fill material 22, source/drain regions 28 and 30 in substrate 16 adjacent gate region fill material 22, sidewall spacer 32 around gate region fill material 24, and source/drain regions 35 and 38 in substrate 16 adjacent gate region fill material 24. In one embodiment, a shallow implant is performed into substrate 16 to form extension regions of each of source/drain regions 28, 30, 35, and 38. Subsequently, spacers 26 and 32 may be formed by depositing a layer of dielectric material and then performing an anisotropic etch. After formation of spacers 26 and 32, a deep implant may be performed into substrate 16 to form source/drain regions 28, 30, 35, and 38.

Figure 5:
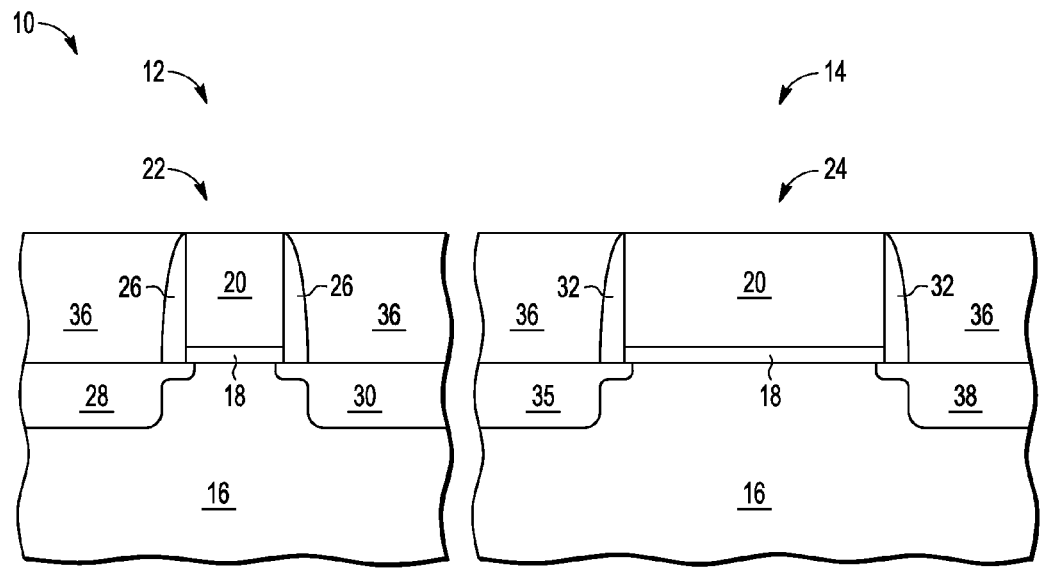

FIG. 5 illustrates, in cross-sectional form, semiconductor device 10 after formation of an interlayer dielectric (ILD) around gate region fill material 22 in logic region 12 and gate region fill material 24 in NVM region 14. ILD 36 is planarized to be coplanar with top surfaces of gate region fill materials 22 and 24, thus exposing the fill material of the gate regions. ILD 36 may be, for example, a low-k material or an oxide.

Figure 6:
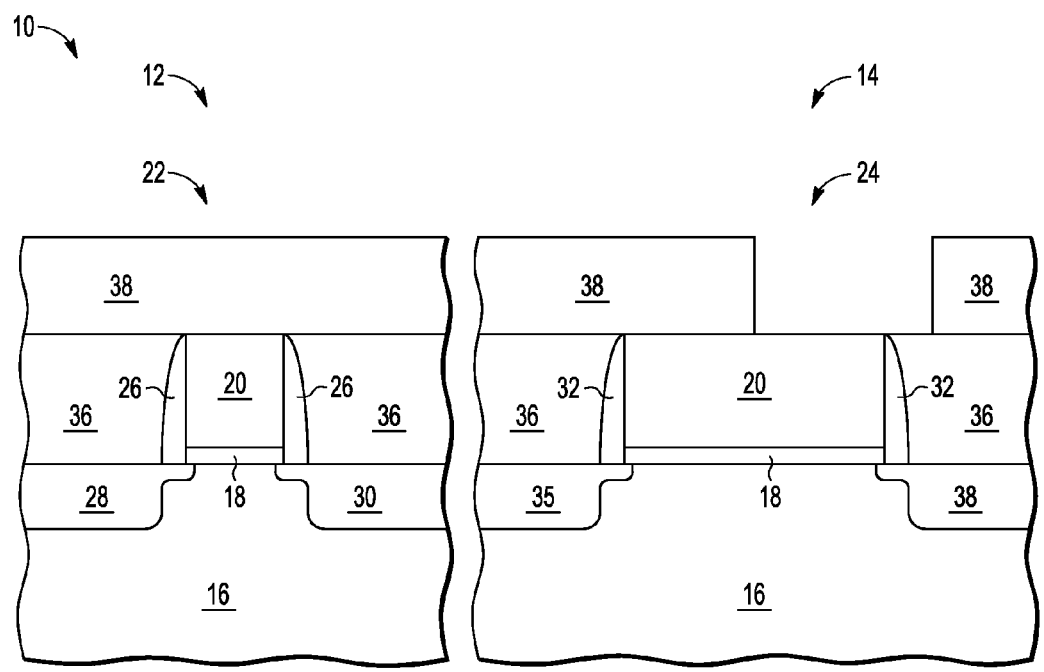

FIG. 6 illustrates, in cross-sectional form, semiconductor device 10 after formation of a patterned masking layer 38 which includes an opening in NVM region 14. The opening exposes a portion of gate region fill material 24 and defines the location of a subsequently formed control gate.

Figure 7:
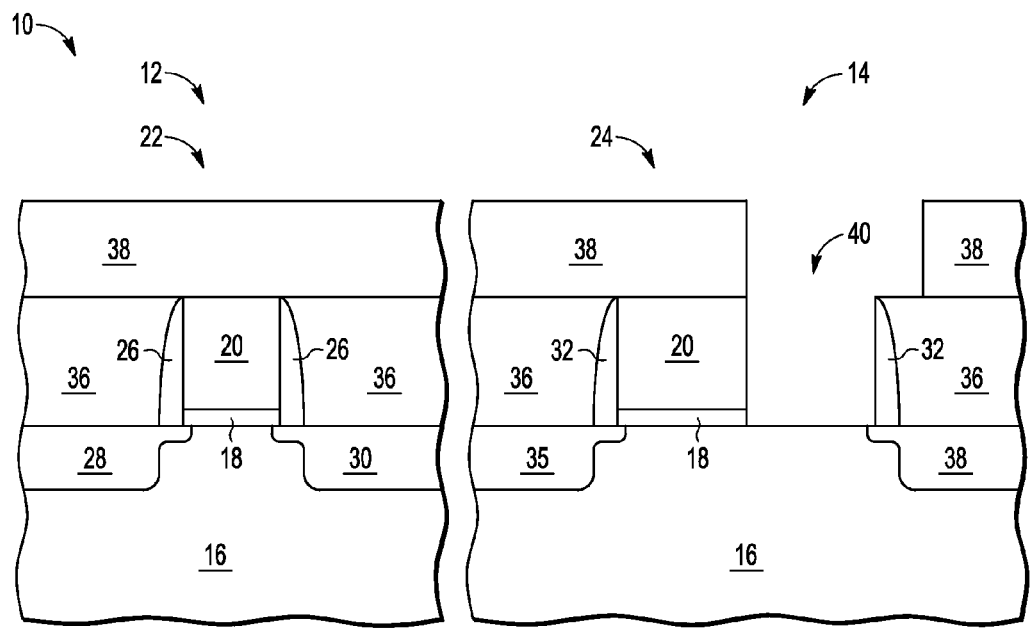

FIG. 7 illustrates, in cross-sectional form, semiconductor device 10 after removal of the exposed portion of gate region fill material 24 as well as the underlying portion of dielectric 18 to form an opening 40 which exposes substrate 16. Note that, in one embodiment, gate region fill material 24 is a material that can be etched selective to the material of ILD 36 and of spacers 26 and 32. In this manner, the right edge of the opening in patterned masking layer 38 may be located over ILD 36 and need not be aligned to the right side of opening 40. This may allow for greater flexibility in the formation of opening 40 since precise alignment may be difficult to achieve. Note that opening 40 is laterally adjacent a remaining portion of gate region fill material 24. Also, in one embodiment, opening 40 may extend further into substrate 16 such that the bottom of opening 40 is below the interface between dielectric 18 and substrate 16. That is, an etch through layer 20 to form opening 40 may form a recess in substrate 16.

Figure 8:
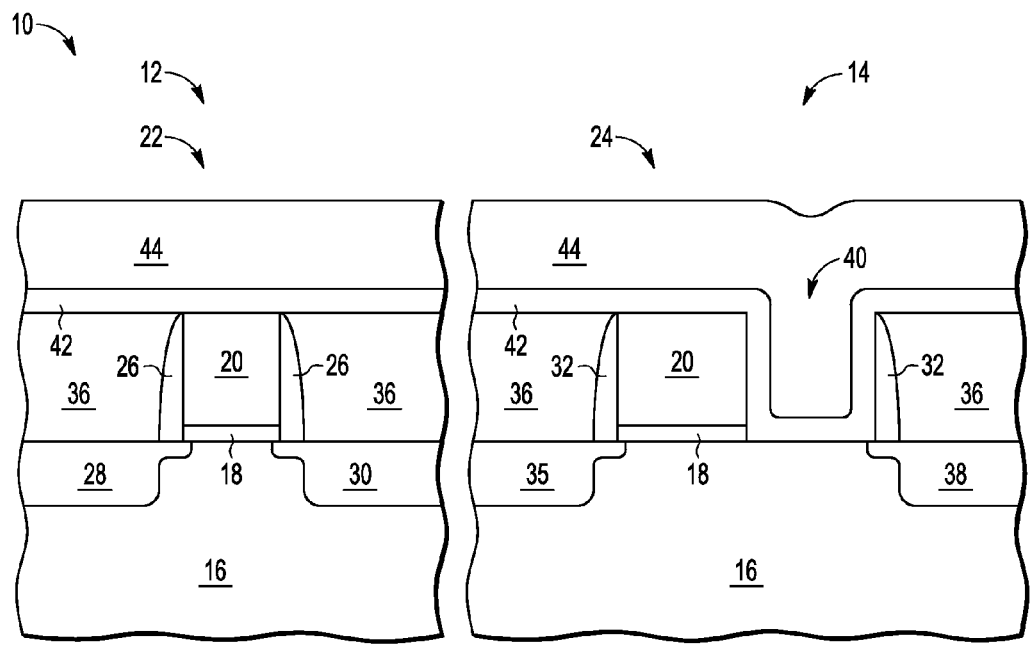

FIG. 8 illustrates, in cross-sectional form, semiconductor device 10 after forming a layer 42 of charge storage material over ILD 36 and gate region fill materials 22 and 24 and within opening 40, and a layer 44 of control gate material over layer 42. Layer 42 may be a layer of nanocrystals surrounded by an insulating material such as oxide and may be formed by bottom grown or deposited dielectric, silicon deposition and anneal that forms nanocrystals, and deposited top dielectric. Layer 44 may be a metal layer or a polysilicon layer.

Figure 9:
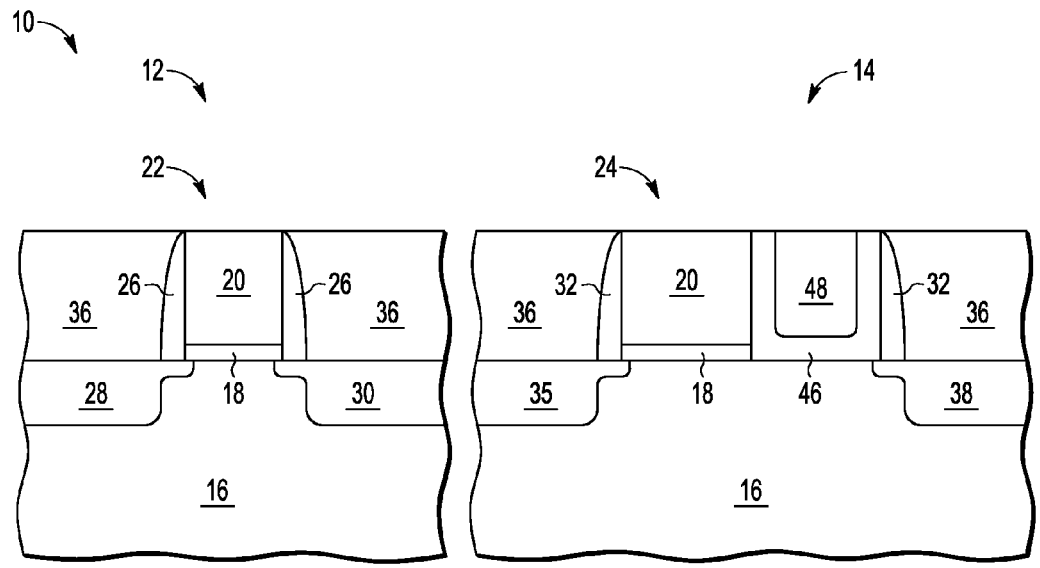

FIG. 9 illustrates, in cross-sectional form, semiconductor device 10 after performing a planarizing step to form a charge storage layer 46 from layer 42 and a control gate 48 on charge storage layer 46 from layer 44 in opening 40. The planarization step may be an etchback or chemical mechanical polishing (CMP). Therefore, note that a portion of gate region fill material 24, which may be referred to as a dummy control gate, and dielectric 18 is removed and replaced with charge storage layer 46 and control gate 48. Charge storage layer 46 is formed on substrate 16 and extends vertically along sidewalls of opening 40.

Figure 10:
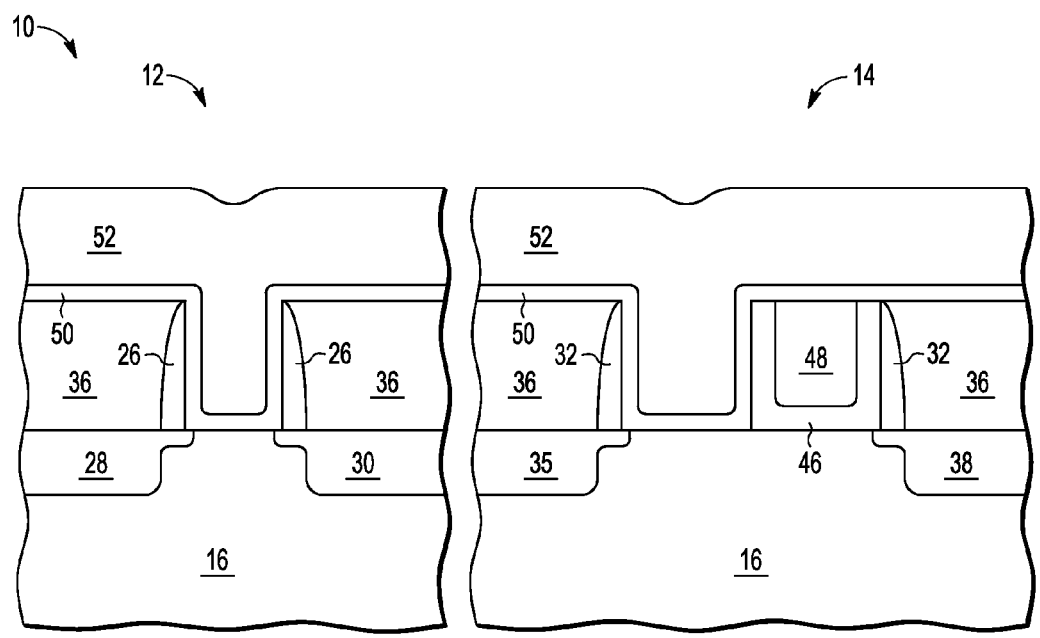

FIG. 10 illustrates, in cross-sectional form, semiconductor device 10 after gate region fill material 22 and gate region fill material 24, as well as the underlying portions of dielectric layer 18, are removed to form a logic gate opening in logic region 12 and a select gate opening in NVM region 14. A high-k dielectric layer 50 is formed over ILD 36 and within the logic gate opening and select gate opening, and a gate layer 52 is formed over high-k dielectric layer 50. In one embodiment, gate layer 52 is a metal layer. In one embodiment, high-k dielectric layer 50 includes a barrier layer. For example, a high-k dielectric is formed over ILD 36 and within the logic gate opening and select gate opening, and a barrier layer is formed over the high-k dielectric, such that the barrier layer is between the high-k dielectric and the overlying metal layer. Metal gate layer 52 may include one or more metal layers.

Figure 11:
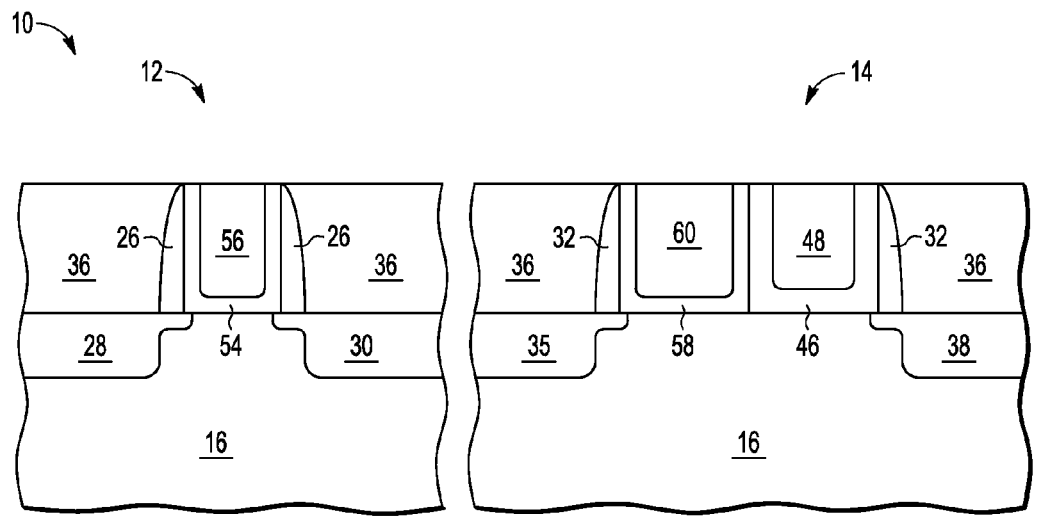

FIG. 11 illustrates, in cross-sectional form, semiconductor device 10 after a planarization step, which may be an etchback or a CMP, to form a logic gate stack in logic region 12 within the logic gate opening and a select gate stack in NVM region 14 within the select gate opening, adjacent control gate 48. The logic gate stack includes a high-k dielectric 54 (formed from high-k dielectric layer 50) that is both on substrate 16 and along the side of sidewall spacer 26, and a logic gate 56 (formed from gate layer 52) on high-k dielectric 54. The select gate stack includes a high-k dielectric 58 (formed from high-k dielectric layer 50) that is on substrate 16, along the side of sidewall spacer 32, and adjacent to the vertical portion of charge storage layer 46, and a select gate 60 (formed from gate layer 52) on high-k gate dielectric 58. Control gate 48 and select gate 60 may correspond to a split-gate NVM cell. In this embodiment, gate fill material 24, as was patterned in FIG. 3, defines a channel length of the resulting NVM cell. Note that in the embodiment described above in reference to FIG. 7, in which opening 40 extends further into substrate 16, charge storage layer 46 and control gate 48 will be recessed into substrate 16 as compared to select gate 60 and dielectric 58 such that the interface between charge storage layer 46 and substrate 16 is below the interface between dielectric 58 and substrate 16.

Therefore, note that gate region fill material 22 (also referred to as a logic dummy gate) and dielectric layer 18 are removed and replaced with a high-k dielectric and a logic gate (which may be a metal, i.e. metallic, logic gate). Also, the remaining portion of gate region fill material 24 (also referred to as a select dummy gate) and dielectric layer 18 are removed and replaced with a high-k dielectric and a select gate (which may be a metal select gate). Therefore, a gate last replacement process may be used to form a high-k dielectric and metal gate for each of the logic gate stack and select gate stack of device 10.

In an alternate embodiment, referring back to FIG. 10, gate region fill material 24 is not removed and not subsequently replaced with a high-k dielectric and a metal select gate. In this embodiment, the resulting device as illustrated in FIG. 11 would still include dielectric layer 18 and gate layer 20. As stated above, gate layer 20 may be polysilicon. In this embodiment, the select gate is a polysilicon gate formed over a thermal oxide gate dielectric. Furthermore, since the select gate is a polysilicon gate, a silicide may be subsequently formed at the top portion of the select gate.

Figure 12:
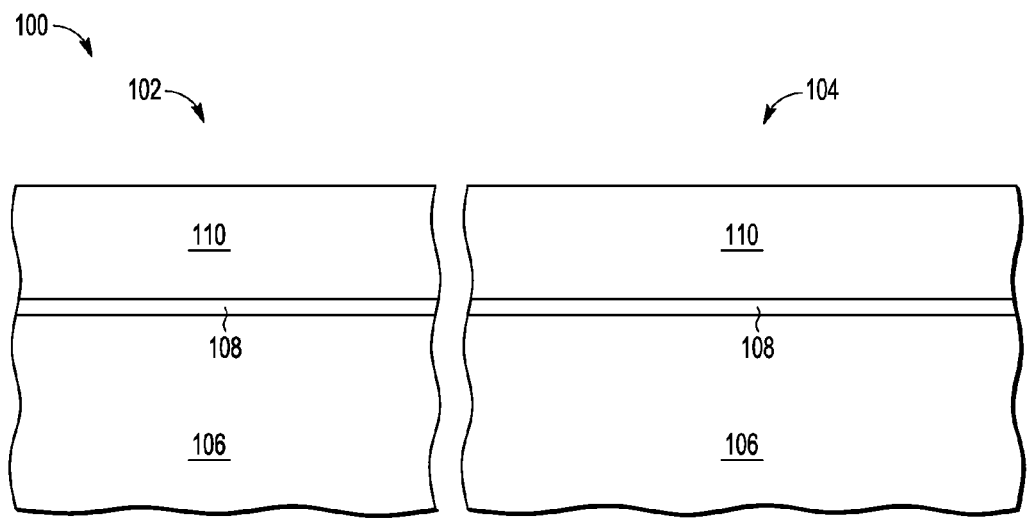
FIGS. 12-20 illustrate, in cross-sectional view, a semiconductor device at various processing stages in accordance with one embodiment of the present invention.

FIG. 12 illustrates, in cross-sectional form, a semiconductor device 100 having a logic region 102 and an NVM region 104 with a substrate 106, a dielectric layer 108 that may be thermal oxide formed on substrate 106, and a layer 110 of gate material that may be polysilicon formed on dielectric layer 108. Dielectric layer 108 may be an oxynitride. In one embodiment, a hard mask layer, which may be silicon nitride, may be formed over gate layer 108. Semiconductor substrate 106 can be any semiconductor material or combinations of materials, such as gallium arsenide, silicon germanium, silicon-on-insulator (SOI), silicon, monocrystalline silicon, the like, and combinations of the above.

Figure 13:
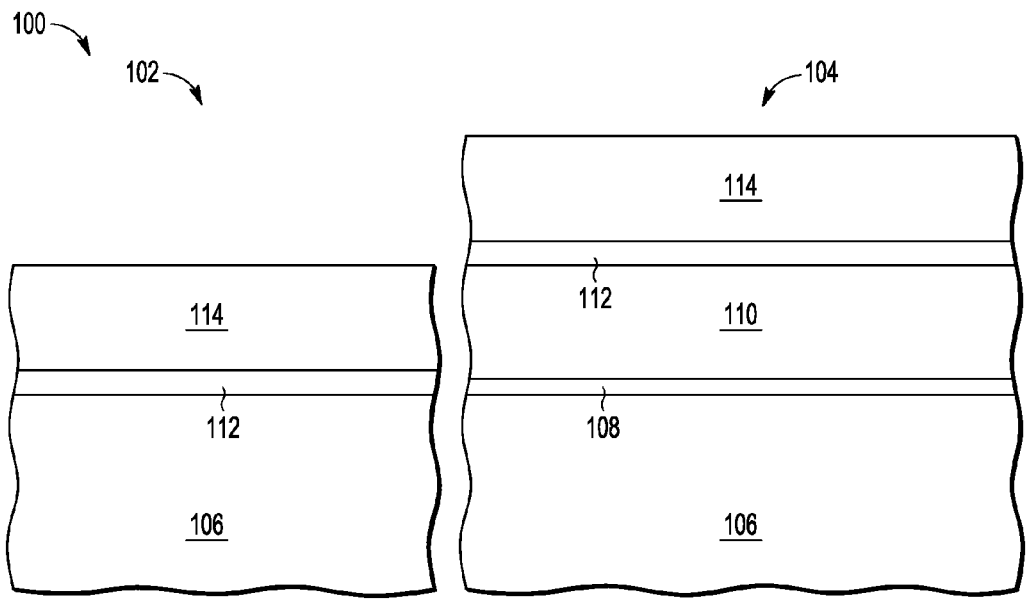

FIG. 13 illustrates, in cross-sectional form, semiconductor device 100 after removing layer 110 and dielectric layer 108 from logic region 102, and forming high-k dielectric layer 112 and layer 114 of gate material that may be polysilicon. A masking layer, such as photo-resist or a hard mask, may be used to protect NVM region 104 during the removal of layers 110 and 108 from logic region 102. Subsequently, high-k dielectric layer 112 may be deposited over substrate 106 in logic region 102 and over layer 110 in NVM region 104. In one embodiment, high-k dielectric layer 112 includes a barrier layer. For example, a high-k dielectric is formed over substrate 106, and a barrier layer is formed over the high-k dielectric, such that the barrier layer is between the high-k dielectric and overlying gate material layer 114.

Figure 14:
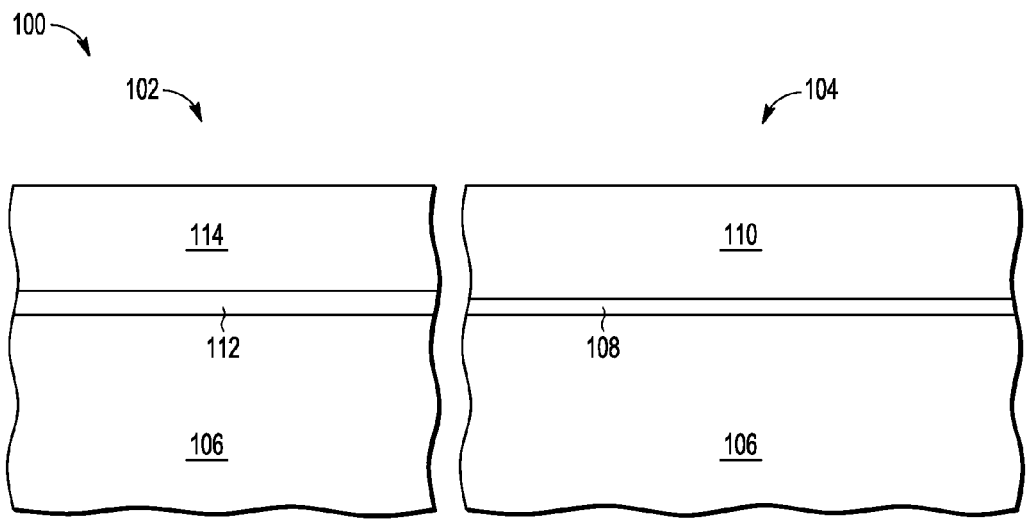

FIG. 14 illustrates, in cross-sectional form, semiconductor device 100 after removal of high-k dielectric layer 112 and layer 114 from NVM region 104. A patterned etch may be performed to remove these layers from NVM region 104.

Figure 15:
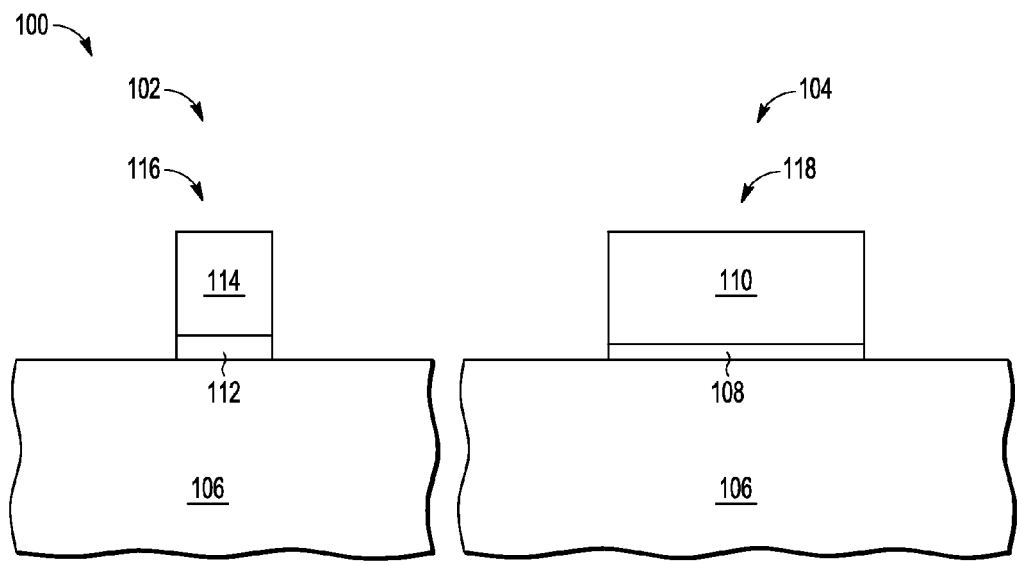

FIG. 15 illustrates, in cross-sectional form, semiconductor device 100 after patterning gate layer 114 in logic region 104 to form a logic dummy gate 116 and patterning gate layer 110 to form a gate region fill material 118. Note that a remaining portion of dielectric 112 remains underlying logic dummy gate 116 and a remaining portion of dielectric layer 108 remains underlying gate region fill material 118. In one embodiment, a patterned masking layer is used to form each of logic dummy gate 116 and gate region fill material 118. A first patterned masking layer may be formed to form one of logic dummy gate 116 and gate region 118, and subsequently, a second patterned masking layer may be formed to form the other of logic dummy gate 116 and gate region 118. Separate masking layers may be used since different materials are being etched for the formation of logic dummy gate 116 than for the formation of gate region 118. Note that logic dummy gate 116 may also be referred to as a gate region fill material or a logic gate region. Also, each of gate region fill material 118 and logic dummy gate 116 may be referred to as gate fill layers. In one embodiment, gate region fill material 118 spans a channel length of a split-gate NVM cell (having a select gate and a control gate) to be formed in NVM region 104, and may therefore be referred to as a memory gate region.

Figure 16:
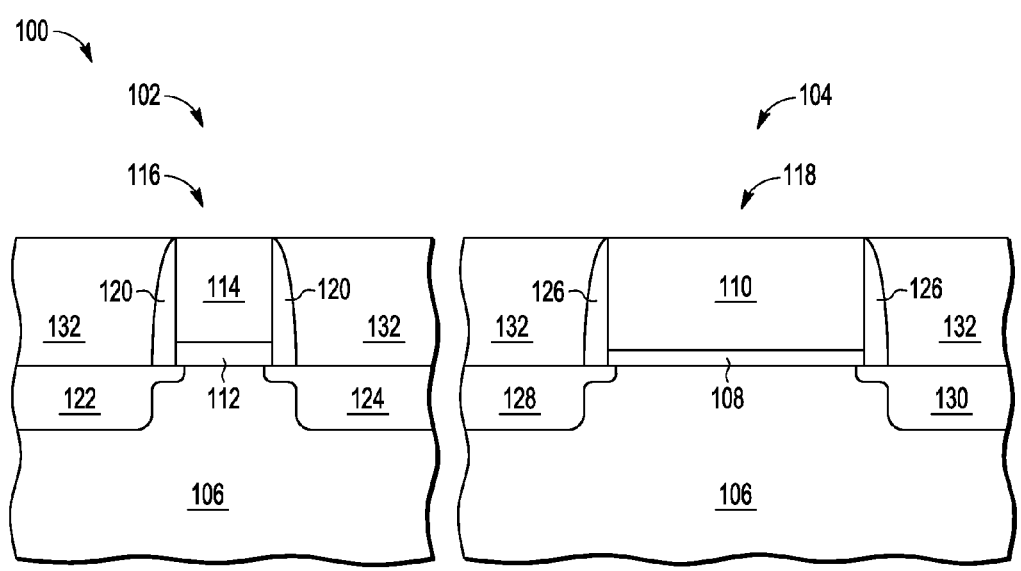

FIG. 16 illustrates, in cross-sectional form, semiconductor device 100 after forming spacers 120 and 126, source/drain regions 122, 124, 128, and 130, and an ILD 132. After formation of logic dummy gate 116 and gate region fill material 118, sidewall spacer 120 is formed around logic dummy gate 116, and sidewall spacer 126 is formed around gate region fill material 118. Source/drain regions 122 and 124 are formed in substrate 106 adjacent dummy logic gate 116, and source/drain regions 128 and 130 are formed in substrate 106 adjacent gate region fill material 118. In one embodiment, a shallow implant is performed into substrate 106 to form extension regions of each of source/drain regions 122, 124, 128, and 130. Subsequently, spacers 120 and 126 may be formed by depositing a layer of dielectric material and then performing an anisotropic etch. After formation of spacers 120 and 126, a deep implant may be performed into substrate 106 to form source/drain regions 122, 124, 128, and 130. After formation of the spacers and source/drain regions, ILD 132 is formed around logic dummy gate 116 in logic region 102 and gate region fill material 118 in NVM region 104. ILD 132 is planarized to be coplanar with top surfaces of logic dummy gate 116 and gate region fill material 118. ILD 132 may be, for example, a low-k material or an oxide.

Figure 17:
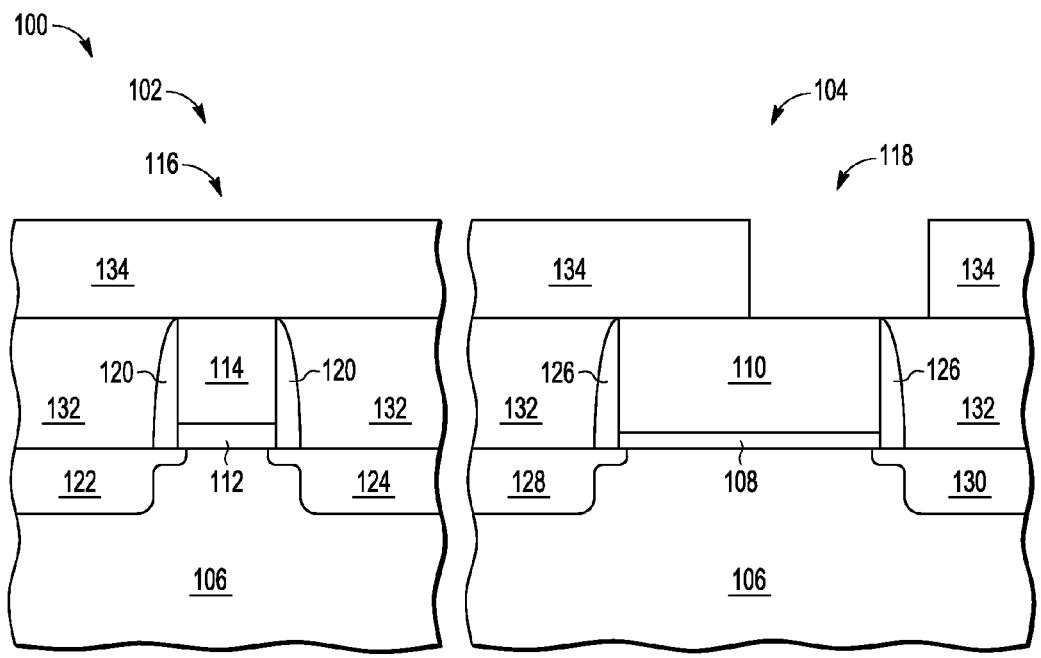

FIG. 17 illustrates, in cross-sectional form, semiconductor device 100 after formation of a patterned masking layer 134 which includes an opening in NVM region 104. The opening exposes a portion of gate region fill material 118 and defines the location of a subsequently formed control gate.

Figure 18:
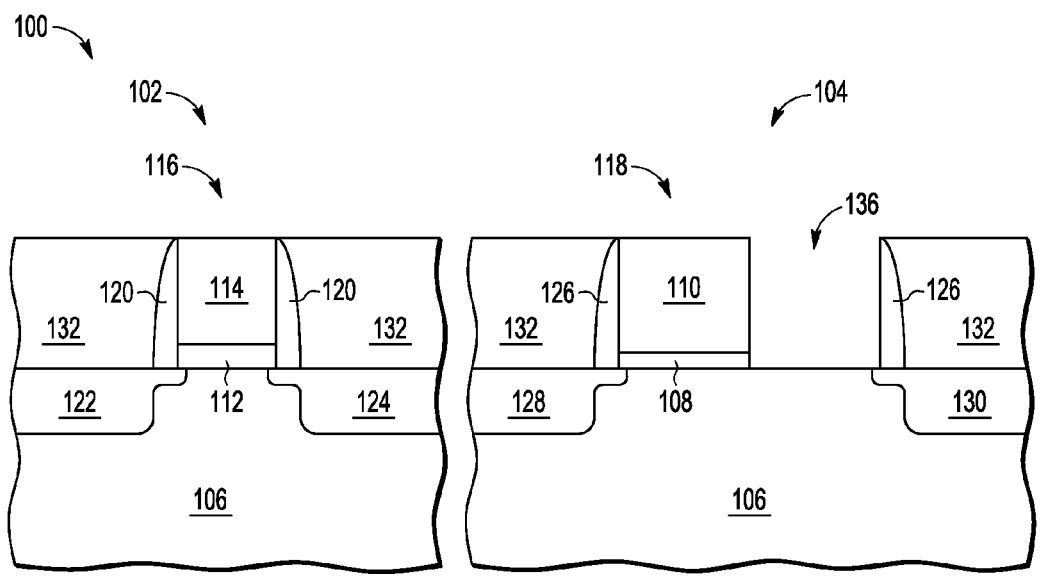

FIG. 18 illustrates, in cross-sectional form, semiconductor device 100 after removal of the exposed portion of gate region fill material 118 as well as the underlying portion of dielectric 108 to form an opening 136 which exposes substrate 106. Note that, in one embodiment, gate region fill material 118 is a material that can be etched selective to the material of ILD 132 and of spacers 120 and 126. In this manner, the right edge of the opening in patterned masking layer 134 may be located over ILD 132 and need not be aligned to the right side of opening 136. This may allow for greater flexibility in the formation of opening 136 since precise alignment may be difficult to achieve. Note that opening 136 is laterally adjacent a remaining portion of gate region fill material 118. Also, in one embodiment, opening 136 may extend further into substrate 106 such that the bottom of opening 136 is below the interface between dielectric 108 and substrate 106. That is, an etch through layer 110 to form opening 136 may form a recess in substrate 106.

Figure 19:
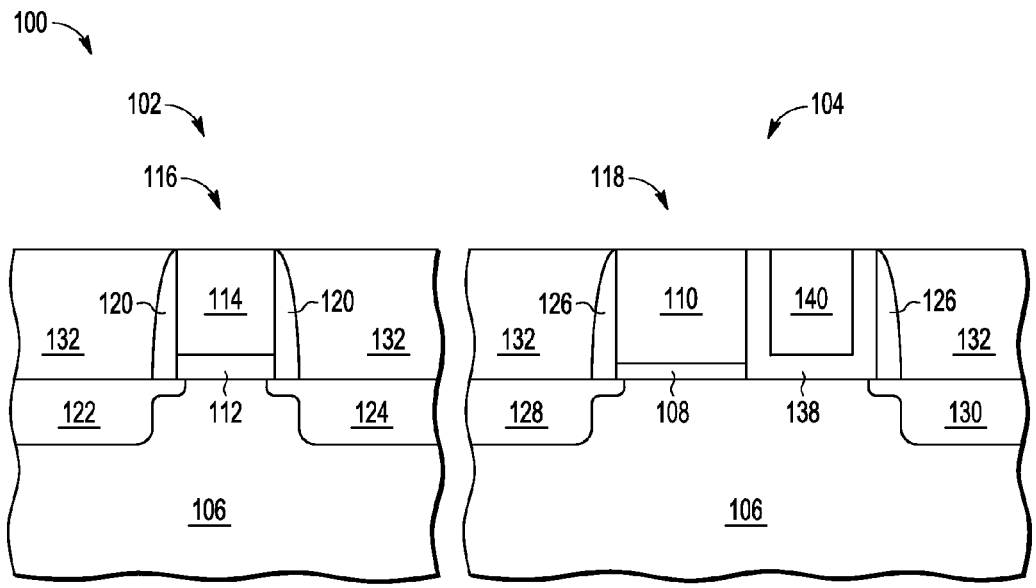

FIG. 19 illustrates, in cross-sectional form, semiconductor device 100 after forming a charge storage layer 138 and a control gate 140 on the charge storage layer in opening 136. Charge storage layer 138 may be a layer of nanocrystals surrounded by an insulating material such as oxide and may be formed by bottom grown or deposited dielectric, silicon deposition and anneal that forms nanocrystals, and a deposited top dielectric. This may be followed by depositing a layer of control gate material and performing a planarizing step that may be an etchback or CMP. Therefore, note that a portion of gate region fill material 118, which may be referred to as a dummy control gate, and dielectric 108 is removed and replaced with charge storage layer 138 and control gate 140. Charge storage layer 138 is formed on substrate 106 and extends vertically along sidewalls of opening 136. Control gate 140 may be a metal gate or a polysilicon gate. In the case of a polysilicon gate, a silicide may be subsequently formed at the top of control gate 140.

Figure 20:
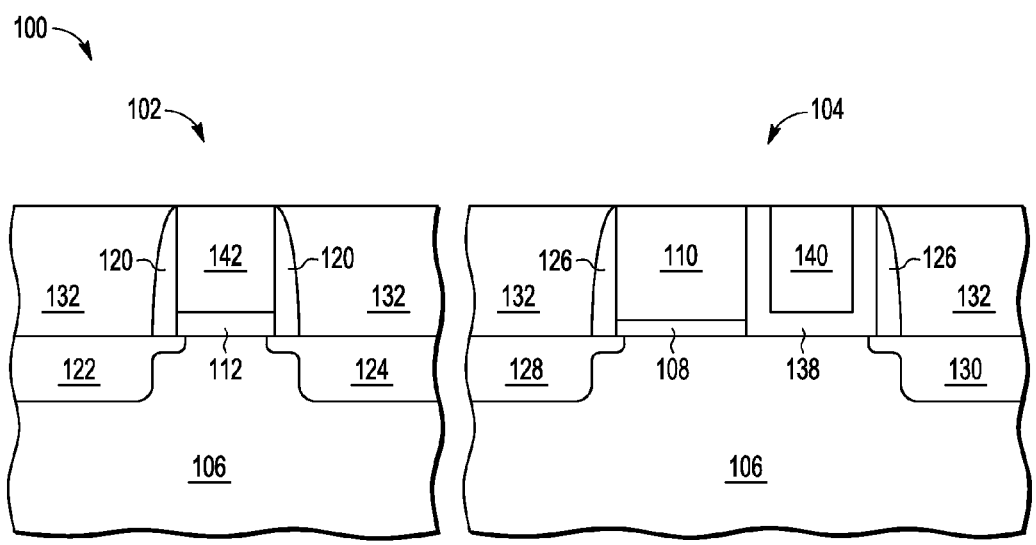

FIG. 20 illustrates, in cross-sectional form, semiconductor device 100 after logic dummy gate 116 is replaced with a metal (i.e. metallic) logic gate 142. Note that the logic gate stack formed in logic region 100 includes a high-k dielectric 112 that is on substrate 106, and a metal logic gate 142 over high-k dielectric 112. In this embodiment, a high-k first metal gate last replacement process may be used to form a high-k dielectric and metal gate for the logic gate stack, while the select-gate may remain polysilicon. Control gate 140 and select gate 110 may correspond to a split gate NVM cell. In this embodiment, gate fill material 118, as was patterned in FIG. 15, defines a channel length of the resulting NVM cell. Note that in the embodiment described above in reference to FIG. 18, in which opening 136 extends further into substrate 106, charge storage layer 138 and control gate 140 will be recessed into substrate 106 as compared to dielectric 108 and select gate 110 such that the interface between charge storage layer 138 and substrate 106 is below the interface between dielectric 108 and substrate 106.

Figure 21:
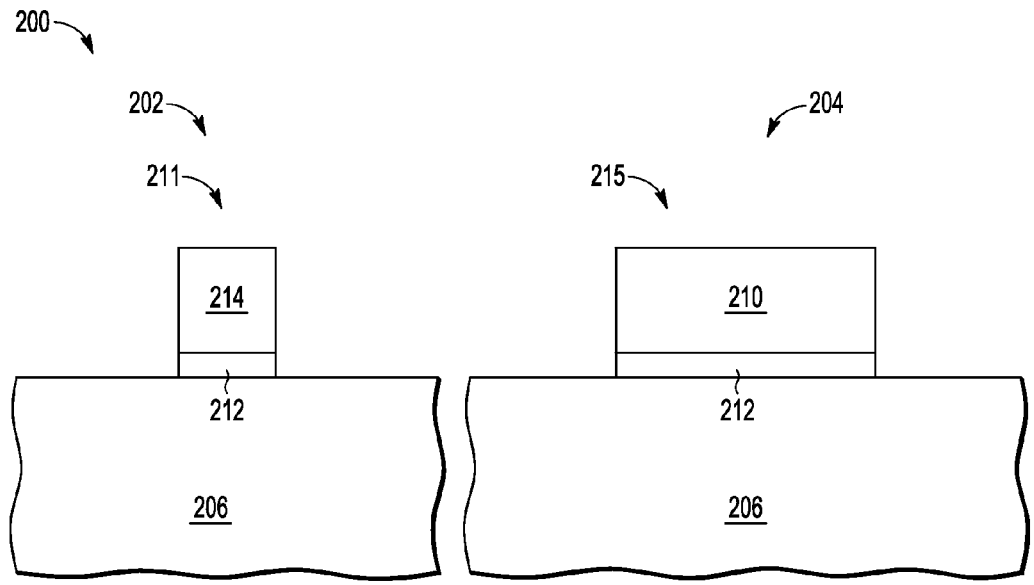
FIGS. 21-25 illustrate, in cross-sectional view, a semiconductor device at various processing stages in accordance with one embodiment of the present invention.

FIG. 21 illustrates, in cross-sectional form, a semiconductor device 200 having a logic region 202 and an NVM region 204 with a substrate 206, a patterned high-k dielectric layer 212 formed on substrate 206, and a patterned layer 214 of gate material that may be polysilicon or nitride formed over high-k dielectric layer 212. In one embodiment, a high-k dielectric layer is formed over substrate 206 in logic region 202 and NVM region 204, and a layer of gate material is formed over high-k dielectric layer 212. In one embodiment, a hard mask layer, which may be silicon nitride, may be formed over gate material layer 214. In one embodiment, high-k dielectric layer 212 includes a barrier layer. For example, a high-k dielectric is formed over substrate 206, and a barrier layer is formed over the high-k dielectric, such that the barrier layer is between the high-k dielectric and overlying gate material layer 214. The layer of gate material may be patterned to form a gate region fill material 211 in logic region 202 and a gate region fill material 215 in NVM region 204. Note that portions of high-k dielectric 212 remain after the patterning under gate regions 211 and 215. Each of gate region fill materials 211 and 215 may be referred to as a gate fill layer. In one embodiment, gate region fill materials 211 and 215 are formed using a same patterned masking layer. Alternatively, each of gate region fill materials 211 and 215 can be formed in separate patterning steps. In one embodiment, gate region fill material 215 spans a channel length of a split-gate NVM cell (having a select gate and control gate) to be formed in NVM region 204, and may therefore be referred to as a memory gate region. In one embodiment, gate region fill material 211 corresponds to the location at which a logic transistor will be formed in logic region 202, and may therefore be referred to as a logic gate region. Semiconductor substrate 206 can be any semiconductor material or combinations of materials, such as gallium arsenide, silicon germanium, silicon-on-insulator (SOI), silicon, monocrystalline silicon, the like, and combinations of the above.

Figure 22:
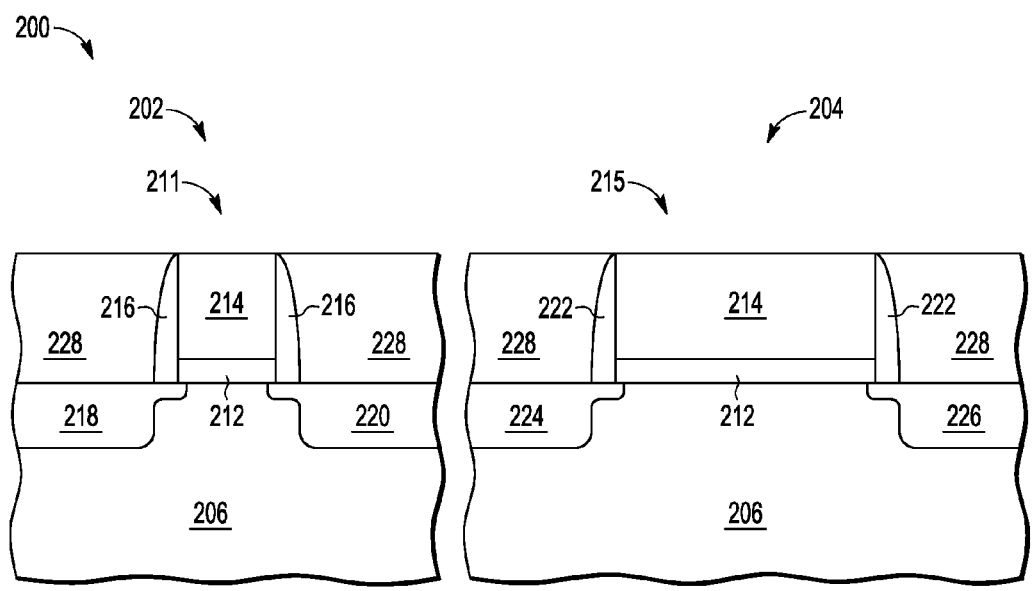

FIG. 22 illustrates, in cross-sectional form, semiconductor device 200 after forming spacers 216 and 222, source/drain regions 218, 220, 224, and 226, and an ILD 228. After formation of gate region fill materials 211 and 215, sidewall spacer 216 is formed around gate region fill material 211, and a sidewall spacer 222 is formed around gate region fill material 215. Source/drain regions 218 and 220 are formed in substrate 206 adjacent gate region fill material 211, and source/drain regions 224 and 226 are formed in substrate 206 adjacent gate region fill material 215. In one embodiment, a shallow implant is performed into substrate 206 to form extension regions of each of source/drain regions 218, 220, 224, and 226. Subsequently, spacers 216 and 222 may be formed by depositing a layer of dielectric material and then performing an anisotropic etch. After formation of spacers 216 and 222, a deep implant may be performed into substrate 206 to form source/drain regions 218, 220, 224, and 226. After formation of the spacers and source/drain regions, ILD 228 is formed around gate region fill material 211 in logic region 202 and gate region fill material 215 in NVM region 204. ILD 228 is planarized to be coplanar with top surfaces of gate regions 211 and 215. ILD 228 may be, for example, a low-k material or an oxide.

Figure 23:
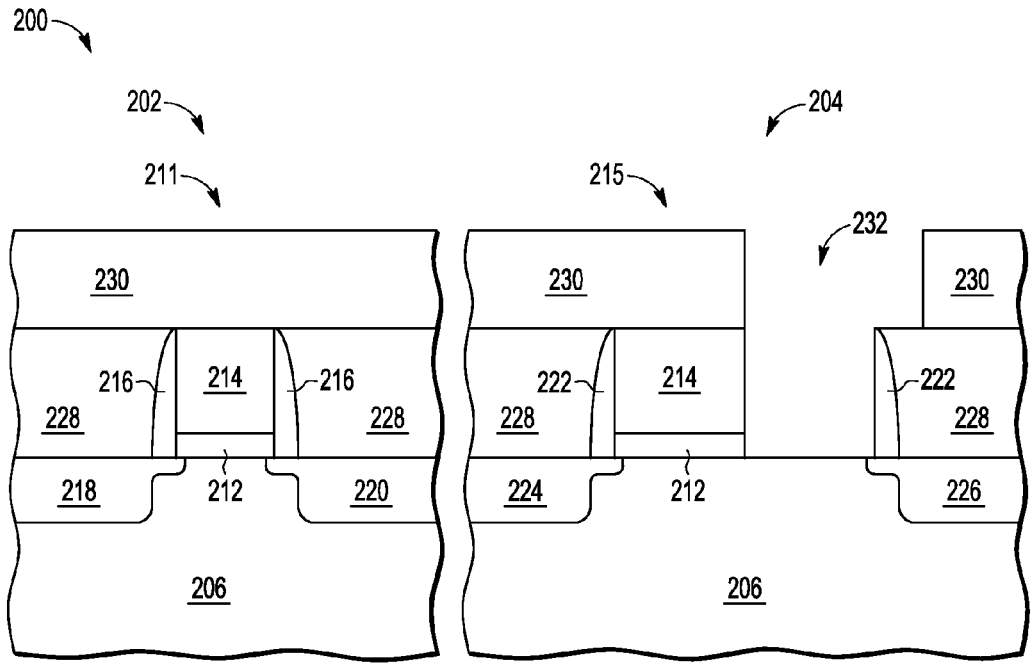

FIG. 23 illustrates, in cross-sectional form, semiconductor device 200 after formation of a patterned masking layer 230 which includes an opening in NVM region 204. The opening exposes a portion of gate region fill material 215 and defines the location of a subsequently formed control gate. Subsequently, the exposed portion of gate region fill material 215 as well as the underlying portion of dielectric 212 are removed to form an opening 232 which exposes substrate 206. Note that, in one embodiment, gate region fill material 215 is of a material that can be etched selective to the material of ILD 228 and of spacers 216 and 222. In this manner, the right edge of the opening in patterned masking layer 230 may be located over ILD 228 and need not be aligned to the right side of opening 232. This may allow for greater flexibility in the formation of opening 232 since precise alignment may be difficult to achieve. Note that opening 232 is laterally adjacent a remaining portion of gate region fill material 215. Also, in one embodiment, opening 232 may extend further into substrate 206 such that the bottom of opening 232 is below the interface between dielectric 212 and substrate 206. That is, an etch through layer 214 to form opening 232 may form a recess in substrate 206.

Figure 24:
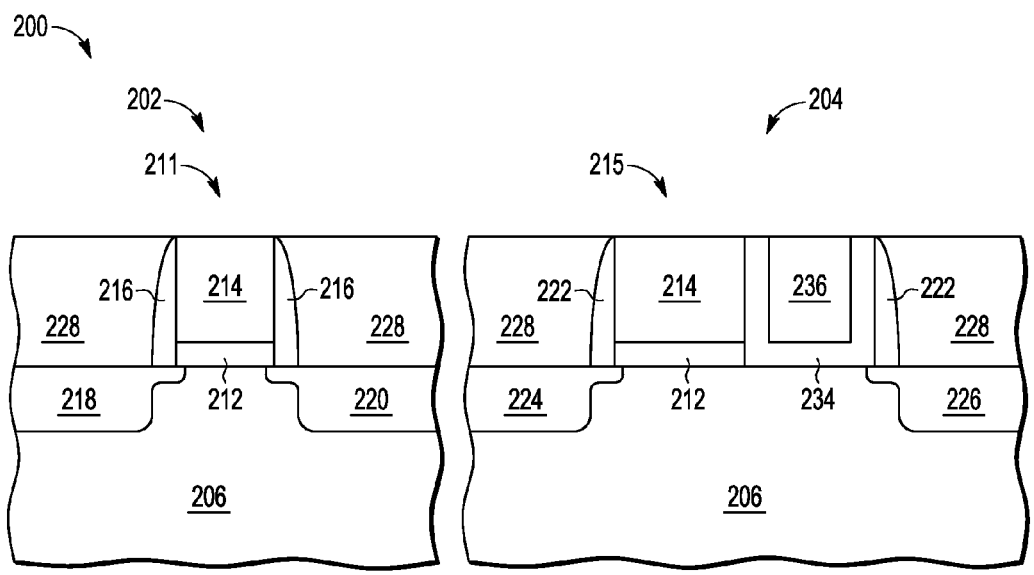

FIG. 24 illustrates, in cross-sectional form, semiconductor device 200 after removal of patterned masking layer 230 and after forming a charge storage layer 234 and a control gate 236 on the charge storage layer in opening 232. Charge storage layer 234 may be a layer of nanocrystals surrounded by an insulating material such as oxide and may be formed by bottom grown or deposited dielectric, silicon deposition and anneal that forms nanocrystals, and a deposited top dielectric. This may be followed by depositing a layer of control gate material and performing a planarizing step that may be an etchback or CMP. Therefore, note that a portion of gate region fill material 215, which may be referred to as a dummy control gate, and high-k dielectric 212 is removed and replaced with charge storage layer 234 and control gate 236. Charge storage layer 234 is formed on substrate 206 and extends vertically along sidewalls of opening 232. Control gate 236 may be a metal gate or a polysilicon gate. In the case of a polysilicon gate, a silicide may be subsequently formed at the top of control gate 236.

Figure 25:
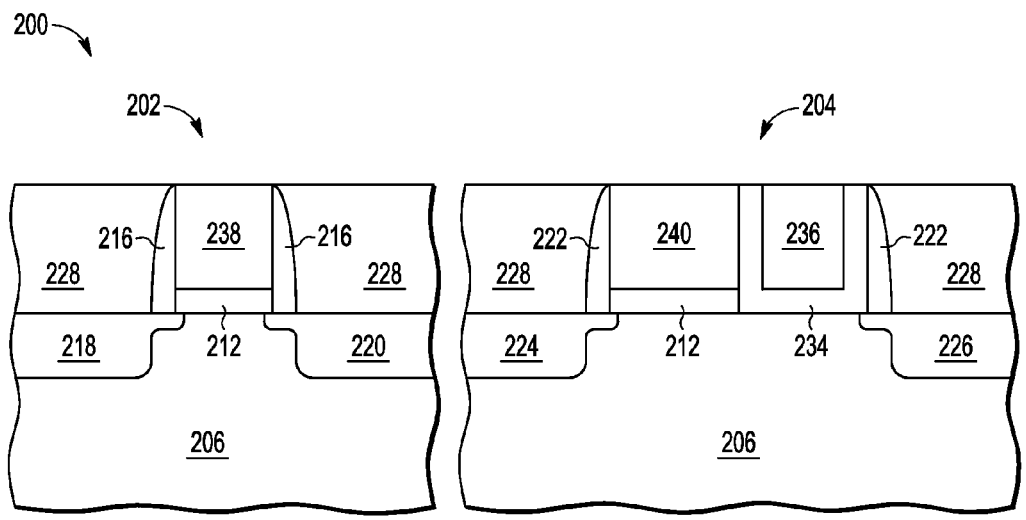

FIG. 25 illustrates, in cross-sectional form, semiconductor device 200 after gate region fill material 211 is replaced with a metal (i.e. metallic) logic gate 238, and gate region fill material 215 is replaced with a metal (i.e. metallic) select gate 240. In one embodiment, gate region fill materials 211 and 215 are removed to form a logic gate opening and a select gate opening, respectively, and a metal gate layer is formed over ILD 238 and within the logic gate and select gate openings. A CMP may then be performed to result in metal logic gate 238 and metal select gate 240. Therefore, a same metal layer may be used to simultaneously form the metal logic gate and the select logic gate. Control gate 236 and select gate 240 may correspond to a split-gate NVM cell. In this embodiment, gate fill material 215, as was patterned in FIG. 21, defines a channel length of the resulting NVM cell. Note that in the embodiment described above in reference to FIG. 23, in which opening 232 extends further into substrate 206, charge storage layer 234 and control gate 236 will be recessed into substrate 206 as compared to dielectric 212 and select gate 240 such that the interface between charge storage layer 234 and substrate 206 is below the interface between dielectric 212 and substrate 206.

Therefore, note that the logic gate stack formed in logic region 202 includes a high-k dielectric 212 that is on substrate 206, and a metal logic gate 238 over high-k dielectric 212, and that the select gate stack formed in NVM region 204 includes a high-k dielectric 212 that is on substrate 206, and a metal select gate 240 over high-k dielectric 212. In this embodiment, a high-k first metal gate last replacement process may be used to form a high-k dielectric and metal gate for the logic gate stack and select gate stack.

Figure 26:
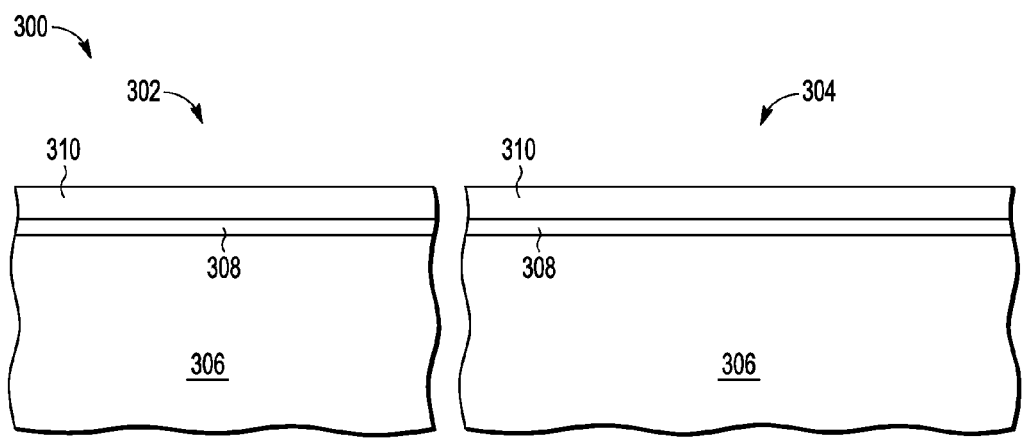
FIGS. 26-34 illustrate, in cross-sectional view, a semiconductor device at various processing stages in accordance with one embodiment of the present invention.

FIG. 26 illustrates, in cross-sectional form, a semiconductor device 300 having a logic region 302 and an NVM region 304 with a substrate 306, a dielectric layer 308 which may be thermal oxide formed on substrate 306, and a thin polysilicon layer 310 formed over dielectric layer 308. Dielectric layer 308 may be an oxynitride. Semiconductor substrate 306 can be any semiconductor material or combinations of materials, such as gallium arsenide, silicon germanium, silicon-on-insulator (SOI), silicon, monocrystalline silicon, the like, and combinations of the above.

Figure 27:
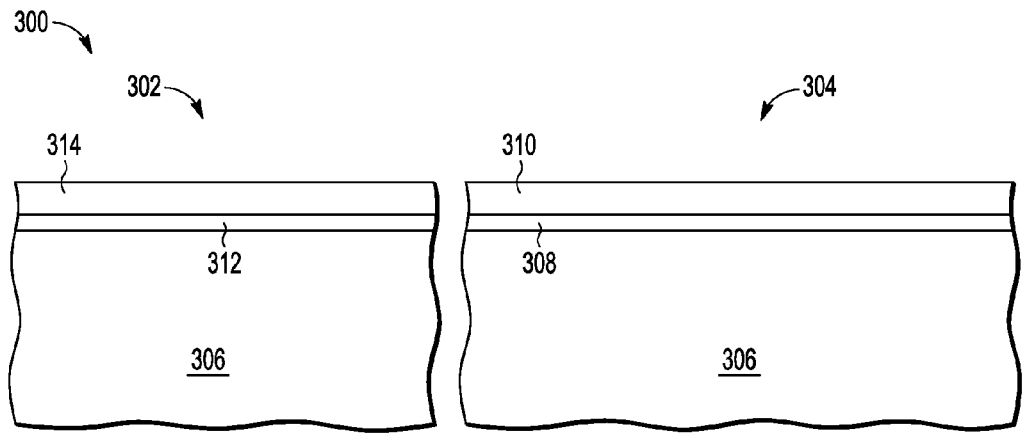

FIG. 27 illustrates, in cross-sectional form, semiconductor device 300 after removing thin polysilicon layer 310 and dielectric layer 308 from logic region 302, and forming a high-k dielectric layer 312 and a barrier layer 314. A masking layer, such as photo resist, may be used to protect NVM region 304 during the removal of layers 310 and 308 from logic region 302. Subsequently, high-k dielectric layer 312 may be deposited over substrate 306 in logic region 302 and over layer 310 in NVM region 304, and barrier layer 314 may be deposited over high-k dielectric layer 312 in logic region 302 and NVM region 304. High-k dielectric layer 312 and barrier layer 314 may then be removed from NVM region 304. A patterned etch may be performed to remove these layers from NVM region 304.

In one embodiment, a combined thickness of high-k dielectric layer 312 and barrier layer 314 in logic region 302 is similar to a combined thickness of dielectric layer 308 and thin polysilicon layer 310 in NVM region 304. In this manner, the step size between layers 314 and 310 at the boundaries between logic region 302 and NVM region 304 is minimized. This may help prevent subsequent CMP complications, such as unwanted dishing.

Figure 28:
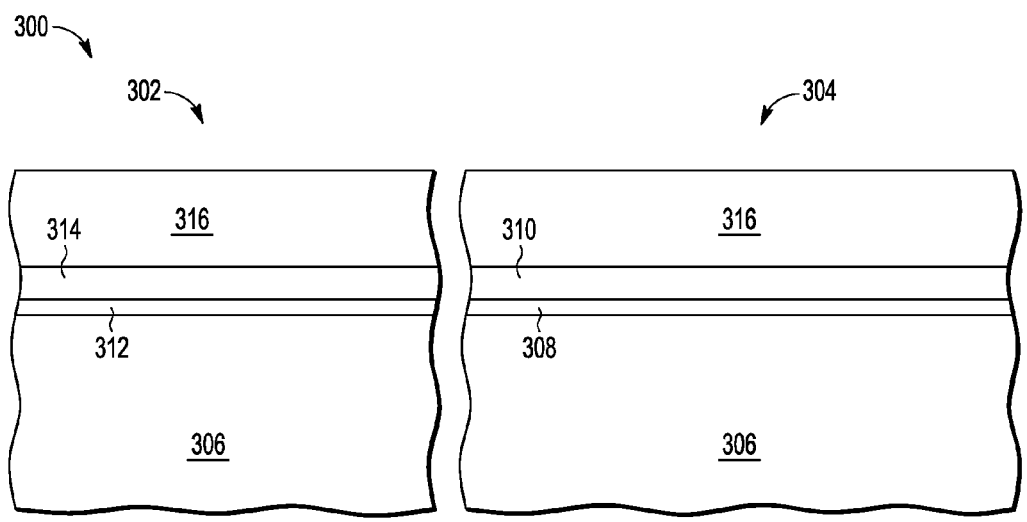

FIG. 28 illustrates, in cross-sectional form, semiconductor device 300 after formation of a thick polysilicon layer 316 over barrier layer 314 in logic region 302 and over thin polysilicon layer 310 in NVM region 304. In one embodiment, thick polysilicon layer 316 is thicker than thin polysilicon layer 310. For example, thin polysilicon layer 310 may have a thickness in a range of 4 to 10 nanometers, and thick polysilicon layer 316 may have a thickness in a range of 20 to 80 nanometers.

Figure 29:
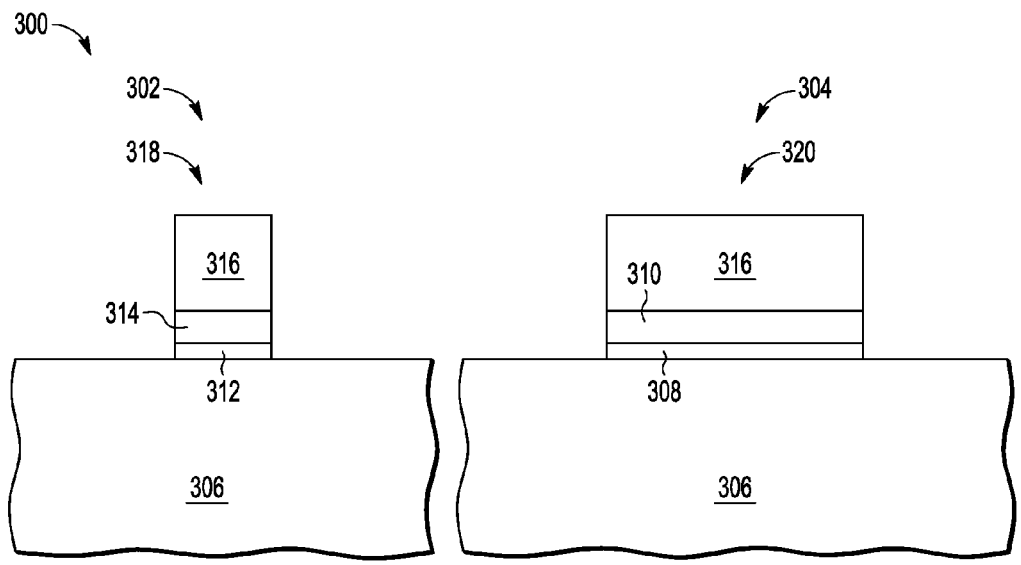

FIG. 29 illustrates, in cross-sectional form, semiconductor device 300 after patterning the layers on substrate 306 to form a logic gate pattern 318 and a dual gate pattern 320. Logic gate pattern 318 corresponds to the location of a logic gate being formed in logic region 302, and includes a portion of barrier layer 314, and a portion of thick polysilicon layer 316. A portion of high-k dielectric layer 312 remains under logic gate pattern 318. Dual gate pattern 320 corresponds to the location of a select gate and control gate of an NVM cell being formed in NVM region 304, and includes a portion of thin polysilicon layer 310 and a portion of thick polysilicon layer 316. A portion of dielectric layer 308 remains under dual gate pattern 320. Note that logic gate pattern 318 may be referred to as a gate region fill material, a logic stack, or a gate fill material, and that dual gate pattern 320 may be referred to as a gate region fill material. Barrier layer 314 of logic gate pattern 318 has a logic gate dimension and polysilicon layer 316 is aligned to barrier layer 314. Logic gate pattern 318 corresponds to the location at which a logic transistor will be formed in logic region 302. Polysilicon layer 310 of dual gate pattern 320 spans a channel length of a split-gate NVM cell (having a select gate and control gate) to be formed in NVM region 304.

Figure 30:
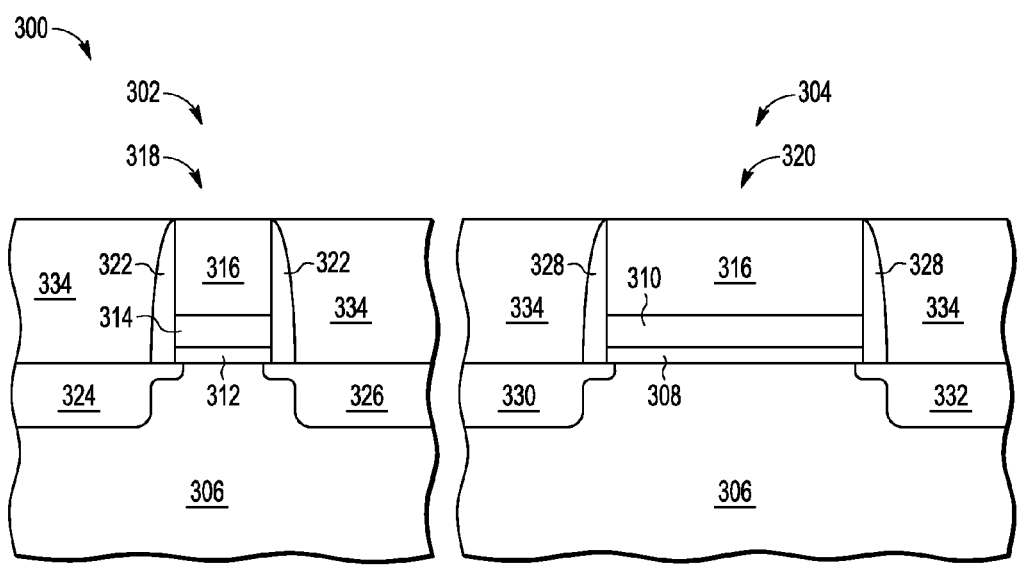

FIG. 30 illustrates, in cross-sectional form, semiconductor device 300 after formation of sidewall spacers 322 and 328, source/drain regions 324, 326, 330, and 332, and an ILD 334. After formation of gate patterns 318 and 320, sidewall spacer 322 is formed around logic gate pattern 318, and a sidewall spacer 328 is formed around dual gate pattern 320. Source/drain regions 324 and 326 are formed in substrate 306 adjacent logic gate pattern 318, and source/drain regions 330 and 332 are formed in substrate 306 adjacent dual gate pattern 320. In one embodiment, a shallow implant is performed into substrate 306 to form extension regions of each of source/drain regions 324, 326, 330, and 332. Subsequently, spacers 322 and 328 may be formed by depositing a layer of dielectric material and then performing an anisotropic etch. After formation of spacers 322 and 328, a deep implant may be performed into substrate 306 to form source/drain regions 324, 326, 330, and 332. After formation of the spacers and source/drain regions, ILD 334 is formed around logic gate pattern 318 in logic region 302 and dual gate pattern 320 in NVM region 304. ILD 334 is planarized to be coplanar with top surfaces of gate patterns 318 and 320. ILD 334 may be, for example, a low-k material or an oxide.

Figure 31:
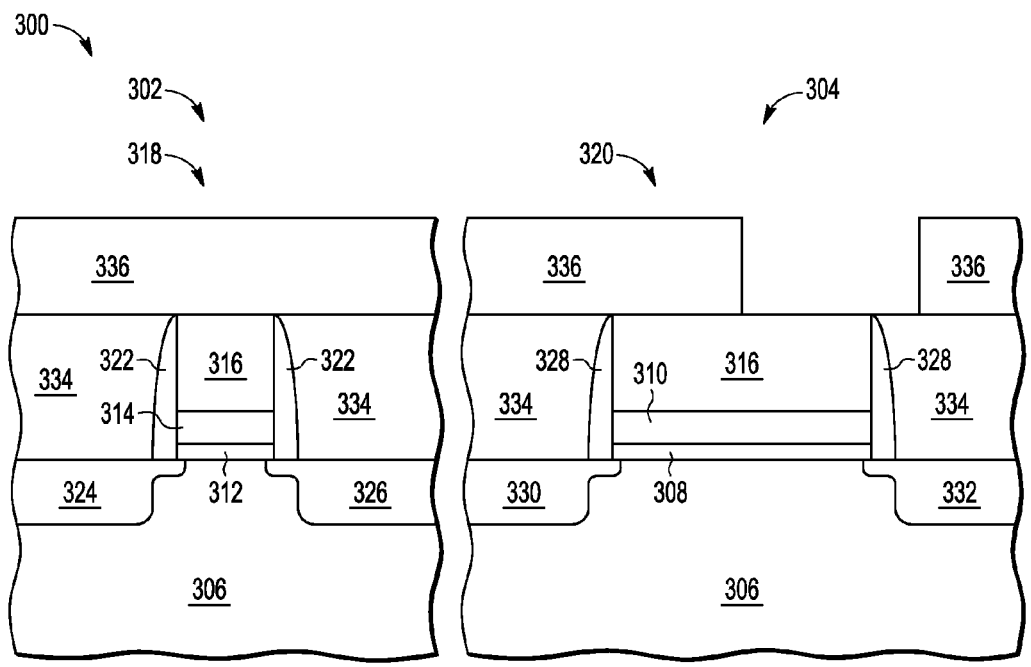

FIG. 31 illustrates, in cross-sectional form, semiconductor device 300 after formation of a patterned masking layer 336 which includes an opening in NVM region 304. The opening exposes a portion of dual gate pattern 320 and defines the location of a subsequently formed control gate.

Figure 32:
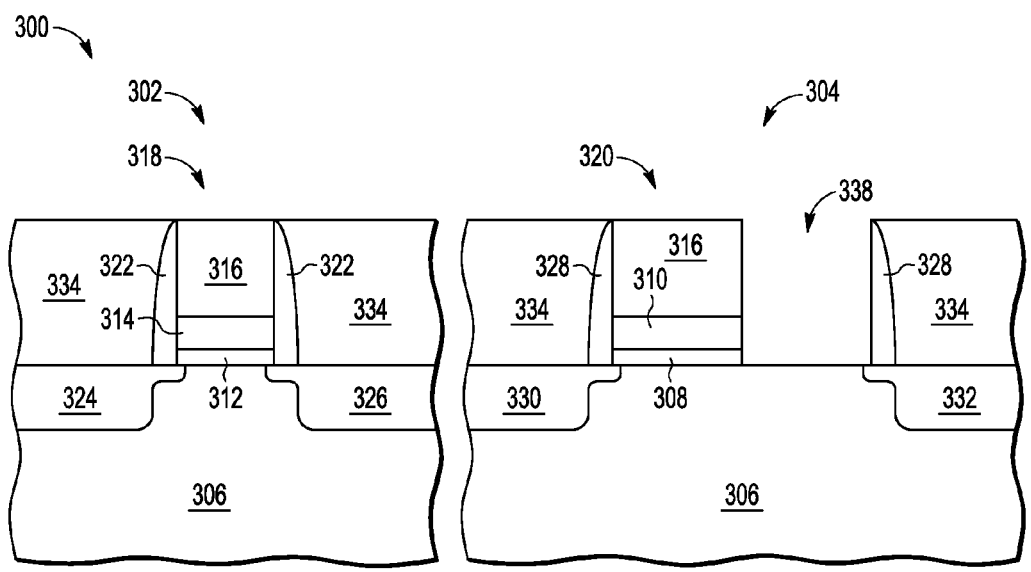

FIG. 32 illustrates, in cross-sectional form, semiconductor device 100 after removal of the exposed portion of dual gate pattern 320 to form an opening 338 which exposes substrate 306. Note that, in one embodiment, the materials of gate pattern 320 are such that they can be etched selective to the material of ILD 334 and of spacers 322 and 328. In this manner, the right edge of the opening in patterned masking layer 336 may be located over ILD 334 and need not be aligned to the right side of opening 338. This may allow for greater flexibility in the formation of opening 338 since precise alignment may be difficult to achieve. Note that opening 338 is laterally adjacent a remaining portion of dual gate pattern 320. Also, in one embodiment, opening 338 may extend further into substrate 306 such that the bottom of opening 338 is below the interface between dielectric 308 and substrate 306. That is, an etch through layers 316 and 310 to form opening 338 may form a recess in substrate 306.

Figure 33:
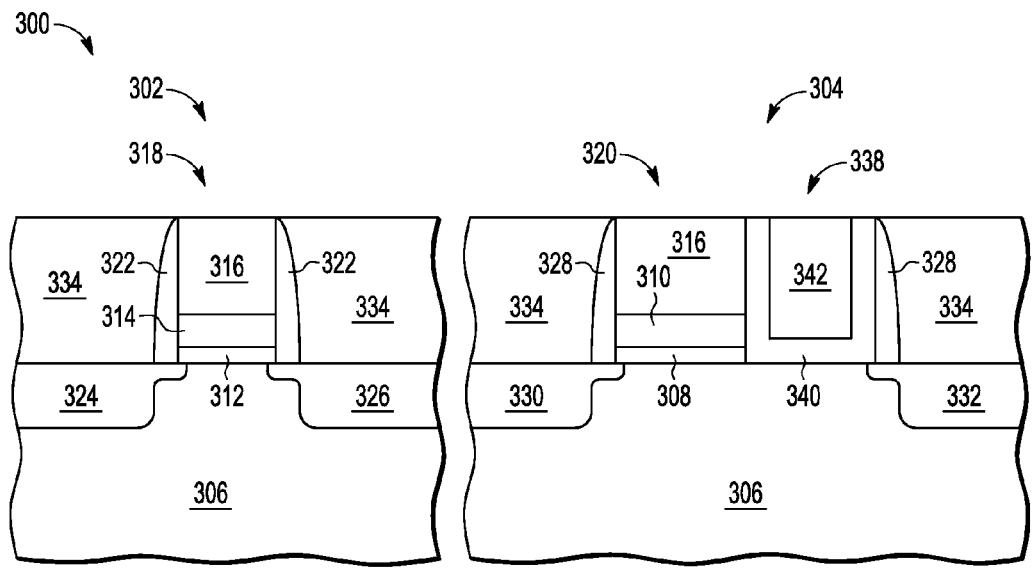

FIG. 33 illustrates, in cross-sectional form, semiconductor device 300 after forming a charge storage layer 340 and a control gate 342 on the charge storage layer in opening 338. Charge storage layer 340 may be a layer of nanocrystals surrounded by an insulating material such as oxide and may be formed by bottom grown or deposited dielectric, silicon deposition and anneal that forms nanocrystals, and a deposited top dielectric. This may be followed by depositing a layer of control gate material and performing a planarizing step that may be an etchback or CMP. Therefore, note that a portion of dual gate pattern 320, which may be referred to as a dummy control gate, is removed and replaced with charge storage layer 340 and control gate 342. Charge storage layer 340 is formed on substrate 306 and extends vertically along sidewalls of opening 338. Control gate 342 may be a metal gate or a polysilicon gate. In the case of a polysilicon gate, a silicide may be subsequently formed at the top of control gate 342.

Figure 34:
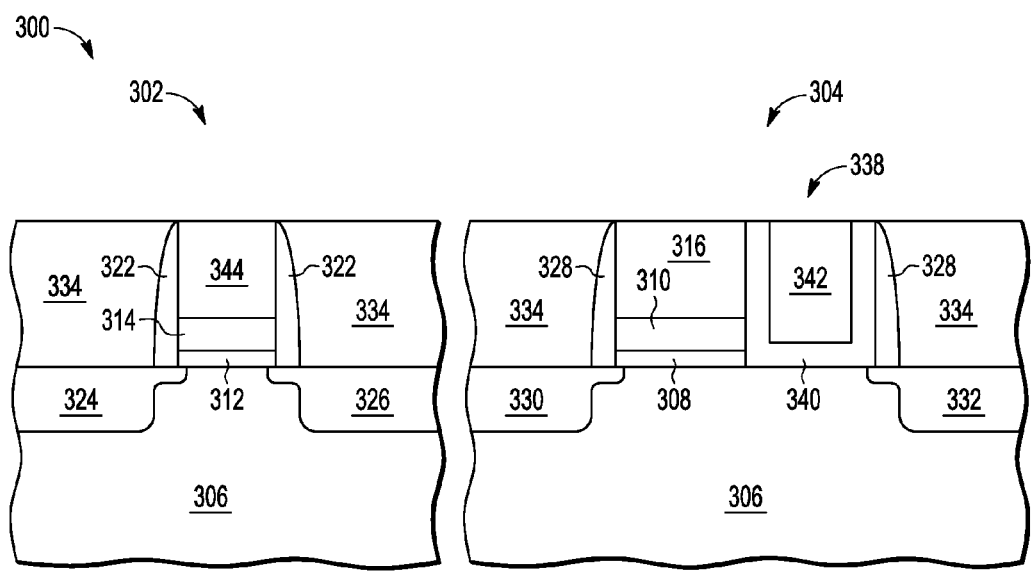

FIG. 34 illustrates, in cross-sectional form, semiconductor device 300 after thick polysilicon layer 316 of logic gate pattern 318 is replaced with a metal logic gate 344. Note that the logic gate stack formed in logic region 302 includes a barrier layer 314 over high-k dielectric layer 312, and a metal logic gate 344 over barrier layer 314. The select gate stack includes a polysilicon select gate including polysilicon layers 310 and 316 over dielectric 308. In this embodiment, a high-k first metal gate last replacement process may be used to form a high-k dielectric and metal gate for the logic gate stack, while the select gate may remain polysilicon. The control gate and select gate may correspond to a split-gate NVM cell. In this embodiment dual gate pattern 320, patterned in FIG. 29, defines a channel length of the resulting NVM cell. Note that in the embodiment described above in reference to FIG. 32, in which opening 338 extends further into substrate 306, charge storage layer 340 and control gate 342 will be recessed into substrate 306 as compared to dielectric 308 and select gate 310/316 such that the interface between charge storage layer 340 and substrate 306 is below the interface between dielectric 308 and substrate 306.

Therefore, by now it should be understood how various integrations of an NVM cell and logic transistor can achieve different combinations of materials for the dielectrics and gates in both the logic transistor and NVM cell. For example, a gate last replacement process may be used to form a high-k dielectric and metal gate for each of the logic gate stack and select gate stack of device 10. Alternatively, a high-k first metal gate last replacement process may be used to form a high-k dielectric and metal gate for the logic gate stack and select gate stack. In another embodiment, a high-k first metal gate last replacement process may be used to form a high-k dielectric and metal gate for the logic gate stack, while allowing the select gate to remain polysilicon. In this manner, logic and NVM can be efficiently integrated within a single integrated circuit.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different types of materials may be used for the charge storage layer. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a method of forming a semiconductor device in an NVM region and in a logic region using a semiconductor substrate, includes forming a gate region fill material over the NVM region and the logic region; patterning the gate region fill material over the NVM region to leave a first patterned gate region fill material over the NVM region; forming an interlayer dielectric around the first patterned gate region fill material; removing a first portion of the first patterned gate region fill material to form a first opening and leaving a second portion of the first patterned gate region fill material, wherein the first opening is laterally adjacent to the second portion; filling the first opening with a charge storage layer and a conductive material comprising metal overlying the charge storage layer. In a further aspect of the above embodiment, the method further includes patterning the gate region material fill material over the logic region while patterning the gate region fill material over the NVM region to leave a second patterned gate region fill material over the logic region; forming the interlayer dielectric around the second patterned gate region fill material while forming the interlayer dielectric around the first patterned gate region fill material; removing the second patterned gate region fill material; and replacing the second patterned gate region fill material with a logic gate comprising metal. In yet a further aspect, the method further includes removing the second portion of the first patterned gate region fill material while removing the second patterned gate region fill material; and replacing the second portion of the first patterned gate region fill material with a select gate comprising metal while replacing the second patterned gate region fill material with the logic gate. In yet an even further aspect, the method further includes forming a gate dielectric comprising a high-k dielectric on the substrate after removing the second portion of the first patterned gate region fill material and the second patterned gate region fill material, wherein the steps of replacing are further characterized by the select gate being on a first portion of the gate dielectric and the logic gate being on a second portion of the gate dielectric. In another yet further aspect, the method further includes forming a first sidewall spacer around the first patterned gate region fill material and a second sidewall spacer around the second patterned gate region fill material prior to forming the interlayer dielectric. In another aspect of the above embodiment, the method further includes removing the gate region fill material from the logic region prior to patterning the gate region fill material over the NVM region. In yet a further aspect, the method further includes forming a high-k dielectric layer over the logic region and the NVM region after removing the gate region fill material from the logic region and prior to patterning the gate region fill material over the NVM region; and forming a second layer of gate region fill material over the high-k dielectric layer. In yet an even further aspect, the method further includes removing the high-k dielectric layer and the second layer of gate region fill material from the NVM region. In another further aspect, the method further includes patterning the second layer of gate region fill material to form a dummy logic gate. In yet a further aspect, the method further includes replacing the dummy logic gate with a metal logic gate. In another aspect of the above embodiment, the method further includes forming a high-k dielectric layer and an overlying barrier layer on the substrate in the logic region and the NVM region prior to forming the gate region fill material. In a further aspect, the method further includes removing the high-k dielectric layer and the overlying barrier layer from the first opening prior to filing the first opening with the charge storage layer and the conductive material comprising metal overlying the charge storage layer. In yet a further aspect, the method further includes patterning the gate region fill material over the logic region while patterning the gate region fill material over the NVM region to leave a second patterned gate region fill material over the logic region; forming the interlayer dielectric layer around the second patterned gate region fill material while forming the interlayer dielectric around the first patterned gate region fill material; removing the second patterned gate region fill material after removing the conductive material comprising metal overlying the charge storage layer; and replacing the second patterned gate region fill material with a logic gate comprising metal. In another aspect of the above embodiment, the method further includes forming a layer of thermal oxide on the substrate in the logic region and in the NVM region prior to forming the gate region fill material, wherein the gate region fill material comprises a first layer of polysilicon, the first layer of polysilicon is on the layer of thermal oxide, and the first layer of polysilicon has a first thickness; replacing the layer of thermal oxide and the first layer of polysilicon in the logic region with a high-k dielectric layer on the substrate and a barrier layer over the high-k dielectric layer; and depositing a second layer of polysilicon on the first layer of polysilicon in the NVM region and the barrier layer in the logic region, wherein the second layer of polysilicon has a second thickness which is greater than the first thickness.

In another embodiment, a method of forming a semiconductor device in an NVM (non-volatile memory) region and in a logic region using a semiconductor substrate, includes forming a first gate fill layer spanning a channel length of a split gate NVM cell in the NVM region; forming a dummy gate in the logic region; replacing a portion of the first gate fill layer with a layer of nanocrystals surrounded by a dielectric and a control gate over the layer of nanocrystals, wherein a select gate location is remaining in the first gate fill layer adjacent to the control gate after the replacing the portion of the first gate fill layer; and replacing the dummy gate with a metallic logic gate. In a further embodiment, the method further includes forming an interlayer dielectric around the dummy gate and the first gate fill layer prior to the replacing the portion of the first gate fill layer.

In yet another embodiment, a method of forming a logic gate in a logic region and a control gate and select gate of an NVM cell in an NVM region, including forming a memory gate region in the NVM region by patterning a layer of polysilicon over a substrate to form a patterned fill material that determines a channel length of the NVM cell in the substrate; forming a logic gate region in the logic region; replacing a portion of the layer of polysilicon with a charge storage layer and a control gate comprising metal, wherein the control gate overlies the charge storage layer. In a further aspect, the method further includes forming a sidewall spacer around the patterned fill material. In yet a further aspect of the yet another embodiment, the replacing comprises etching through the layer of polysilicon and into the substrate to form a recess in the substrate. In yet an even further aspect of the yet another embodiment, the replacing the portion of the layer of polysilicon with a charge storage layer and a control gate is further characterized by the charge storage layer including nanocrystals.

What is claimed is:

1. A method of forming a semiconductor device in an NVM (non-volatile memory) region and in a logic region using a semiconductor substrate, comprising:
    forming a gate region fill material over the NVM region and the logic region;
    patterning the gate region fill material over the NVM region to leave a first patterned gate region fill material over the NVM region;
    forming an interlayer dielectric around the first patterned gate region fill material;
    removing a first portion of the first patterned gate region fill material to form a first opening and leaving a second portion of the first patterned gate region fill material, wherein the first opening is laterally adjacent to the second portion;
    filling the first opening with a charge storage layer and a conductive material comprising metal overlying the charge storage layer.

2. The method of claim 1, further comprising:
    patterning the gate region material fill material over the logic region while patterning the gate region fill material over the NVM region to leave a second patterned gate region fill material over the logic region;
    forming the interlayer dielectric around the second patterned gate region fill material while forming the interlayer dielectric around the first patterned gate region fill material;
    removing the second patterned gate region fill material; and
    replacing the second patterned gate region fill material with a logic gate comprising metal.

3. The method of claim 2, further comprising:
    removing the second portion of the first patterned gate region fill material while removing the second patterned gate region fill material; and
    replacing the second portion of the first patterned gate region fill material with a select gate comprising metal while replacing the second patterned gate region fill material with the logic gate.

4. The method of claim 3, further comprising forming a gate dielectric comprising a high-k dielectric on the substrate after removing the second portion of the first patterned gate region fill material and the second patterned gate region fill material, wherein the steps of replacing are further characterized by the select gate being on a first portion of the gate dielectric and the logic gate being on a second portion of the gate dielectric.

5. The method of claim 2, further comprising forming a first sidewall spacer around the first patterned gate region fill material and a second sidewall spacer around the second patterned gate region fill material prior to forming the interlayer dielectric.

6. The method of claim 1, further comprising:
    removing the gate region fill material from the logic region prior to patterning the gate region fill material over the NVM region.

7. The method of claim 6, further comprising:
    forming a high-k dielectric layer over the logic region and the NVM region after removing the gate region fill material from the logic region and prior to patterning the gate region fill material over the NVM region; and
    forming a second layer of gate region fill material over the high-k dielectric layer.

8. The method of claim 7, further comprising:
    removing the high-k dielectric layer and the second layer of gate region fill material from the NVM region.

9. The method of claim 8, further comprising patterning the second layer of gate region fill material to form a dummy logic gate.

10. The method of claim 9, further comprising replacing the dummy logic gate with a metal logic gate.

11. The method of claim 1, further comprising forming a high-k dielectric layer and an overlying barrier layer on the substrate in the logic region and the NVM region prior to forming the gate region fill material.

12. The method of claim 11, further comprising:
removing the high-k dielectric layer and the overlying barrier layer from the first opening prior to filing the first opening with the charge storage layer and the conductive material comprising metal overlying the charge storage layer.

13. The method of claim 12, further comprising:
patterning the gate region fill material over the logic region while patterning the gate region fill material over the NVM region to leave a second patterned gate region fill material over the logic region;
forming the interlayer dielectric layer around the second patterned gate region fill material while forming the interlayer dielectric around the first patterned gate region fill material;
removing the second patterned gate region fill material after removing the conductive material comprising metal overlying the charge storage layer; and
replacing the second patterned gate region fill material with a logic gate comprising metal.

14. The method of claim 1, further comprising:
forming a layer of thermal oxide on the substrate in the logic region and in the NVM region prior to forming the gate region fill material, wherein the gate region fill material comprises a first layer of polysilicon, the first layer of polysilicon is on the layer of thermal oxide, and the first layer of polysilicon has a first thickness;
replacing the layer of thermal oxide and the first layer of polysilicon in the logic region with a high-k dielectric layer on the substrate and a barrier layer over the high-k dielectric layer; and
depositing a second layer of polysilicon on the first layer of polysilicon in the NVM region and the barrier layer in the logic region, wherein the second layer of polysilicon has a second thickness which is greater than the first thickness.

15. A method of forming a semiconductor device in an NVM (non-volatile memory) region and in a logic region using a semiconductor substrate, comprising:
forming a first gate fill layer spanning a channel length of a split gate NVM cell in the NVM region;
forming a dummy gate in the logic region;
replacing a portion of the first gate fill layer with a layer of nanocrystals surrounded by a dielectric and a control gate over the layer of nanocrystals, wherein a select gate location is remaining in the first gate fill layer adjacent to the control gate after the replacing the portion of the first gate fill layer; and
replacing the dummy gate with a metallic logic gate.

16. The method of claim 15, further comprising forming an interlayer dielectric around the dummy gate and the first gate fill layer prior to the replacing the portion of the first gate fill layer.

17. A method of forming a logic gate in a logic region and a control gate and select gate of an NVM (non-volatile memory) cell in an NVM region, comprising:
forming a memory gate region in the NVM region by patterning a layer of polysilicon over a substrate to form a patterned fill material that determines a channel length of the NVM cell in the substrate;
forming a logic gate region in the logic region;
replacing a portion of the layer of polysilicon with a charge storage layer and a control gate comprising metal, wherein the control gate overlies the charge storage layer.

18. The method of claim 17 further comprising forming a sidewall spacer around the patterned fill material.

19. The method of claim 18, wherein the replacing comprises etching through the layer of polysilicon and into the substrate to form a recess in the substrate.

20. The method of claim 19, wherein the replacing the portion of the layer of polysilicon with a charge storage layer and a control gate is further characterized by the charge storage layer comprising nanocrystals.

* * * * *